(12) United States Patent
Liu et al.

(10) Patent No.: US 11,313,927 B2
(45) Date of Patent: Apr. 26, 2022

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Liu Liu, Shanghai (CN); Guannan Liu, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 126 days.

(21) Appl. No.: 16/789,471

(22) Filed: Feb. 13, 2020

(65) Prior Publication Data

US 2020/0256936 A1 Aug. 13, 2020

(30) Foreign Application Priority Data

Feb. 13, 2019 (CN) .................. 201910115344.X

(51) Int. Cl.
*G01R 33/28* (2006.01)
*G01R 33/3875* (2006.01)
(Continued)

(52) U.S. Cl.
CPC ....... *G01R 33/288* (2013.01); *G01R 33/3875* (2013.01); *G01R 33/543* (2013.01); *G01R 33/58* (2013.01)

(58) Field of Classification Search
USPC ....................................................... 324/309
See application file for complete search history.

(56) References Cited

U.S. PATENT DOCUMENTS

2008/0129290 A1 6/2008 Yao
2013/0249553 A1 9/2013 Simonetti et al.
(Continued)

FOREIGN PATENT DOCUMENTS

CN 101499177 A 8/2009
CN 102379698 A 3/2012
(Continued)

OTHER PUBLICATIONS

First Office Action in Chinese Application No. 201910115344.X dated Aug. 20, 2020, 18 pages.
(Continued)

*Primary Examiner* — Rodney E Fuller
(74) *Attorney, Agent, or Firm* — Metis IP LLC

(57) ABSTRACT

A method may include obtaining image data of a subject acquired by an imaging device. The method may also include determining one or more characteristics associated with a body part of the subject from the image data. The one or more characteristics of the body part of the subject may include at least one of position information of the body part in the subject, geometric morphology information of the body part, water content information, or fat content information. The method may also include determining, based on one or more characteristics associated with the body part, values of one or more individualized parameters corresponding to the subject. The method may further include causing the imaging device to perform an imaging scan on the subject according to the values of the one or more individualized parameters.

20 Claims, 13 Drawing Sheets

(51) Int. Cl.
*G01R 33/58* (2006.01)
*G01R 33/54* (2006.01)

(56) References Cited

U.S. PATENT DOCUMENTS

| | | |
|---|---|---|
| 2013/0249554 A1 | 9/2013 | Simonetti et al. |
| 2013/0252196 A1* | 9/2013 | Rasche ................ G01R 33/546 433/29 |
| 2014/0148685 A1* | 5/2014 | Liu ........................ A61B 6/542 600/411 |
| 2015/0054510 A1 | 2/2015 | Biber et al. |
| 2015/0268321 A1 | 9/2015 | Zhai et al. |
| 2016/0307301 A1 | 10/2016 | Zhou et al. |
| 2016/0313416 A1 | 10/2016 | Nielsen |
| 2017/0319154 A1 | 11/2017 | Andreyev et al. |
| 2018/0098712 A1 | 4/2018 | Chen et al. |
| 2018/0364317 A1 | 12/2018 | Shen et al. |
| 2020/0008702 A1* | 1/2020 | Yokosawa ............... A61B 5/742 |

FOREIGN PATENT DOCUMENTS

| | | |
|---|---|---|
| CN | 104424386 A | 3/2015 |
| CN | 104865545 A | 8/2015 |
| CN | 163646410 B | 6/2016 |
| CN | 106680750 A | 5/2017 |
| CN | 107280669 A | 10/2017 |
| CN | 107669273 A | 2/2018 |
| CN | 106132274 A | 6/2018 |

OTHER PUBLICATIONS

Giuseppe Potente et al., Practical Application of Contrast-enhanced Magnetic Resonance Mammography [CE-MRM] by an Algorithm Combining Morphological and Enhancement Patterns, Computerized Medical Imaging and Graphics, 33(2): 83-90, 2009.

Tian, Ye et al., Automated Localization of Body Part in CT Images, Computer Engineering and Design, 38(1): 247-252, 2017.

* cited by examiner

Image 1 Image 2

Image 3 Image 4

Image 5  Image 6

SYSTEMS AND METHODS FOR MAGNETIC RESONANCE IMAGING

CROSS-REFERENCE TO RELATED APPLICATIONS

This application claims priority of Chinese Patent Application No. 201910115344.X, filed on Feb. 13, 2019, the contents of which are hereby incorporated by reference.

TECHNICAL FIELD

The disclosure generally relates to imaging systems, and more particularly relates to systems and methods for magnetic resonance imaging.

BACKGROUND

Magnetic resonance imaging (MRI) is widely used in disease diagnosis and/or treatment. In an MRI system, the calibration of system parameters (e.g., the amplitude of a radiofrequency (RF) transmitting field, a transmitting gain of a radiofrequency field, etc.) for a patient himself may influence the quality of image data acquired by the MRI system. Usually, scanning sequence parameters and/or image reconstruction parameters may be determined and/or calibrated before an MR scan of a subject. However, the calibration of one or more system parameters for a subject may be rarely performed or involve complex manual operations, which may decrease the accuracy and/or efficiency of the calibration of the one or more system parameters. Therefore, it is desired to provide methods and systems for calibrating system parameters with improved accuracy and efficiency.

SUMMARY

According to a first aspect of the present disclosure, a system is provided. The system may include at least one storage device storing executable instructions, and at least one processor in communication with the at least one storage device. When executing the executable instructions, the at least one processor may cause the system to perform one or more of the following operations. The system may obtain image data of a subject acquired by an imaging device. The system may further determine one or more characteristics associated with a body part of the subject from the image data. The one or more characteristics of the body part of the subject may include at least one of position information of the body part in the subject, geometric morphology information of the body part, water content information, or fat content information. The system may further determine, based on one or more characteristics associated with the body part, values of one or more individualized parameters corresponding to the subject. The system may cause the imaging device to perform an imaging scan on the subject according to the values of the one or more individualized parameters.

In some embodiments, the imaging device may include a magnetic resonance (MR) scanner, and the image data may be acquired by the imaging device via scanning the subject according to a fast pulse sequence.

In some embodiments, the image data of the subject may include a scout image associated with the body part of the subject.

In some embodiments, the image data of the subject may include at least one of an amplitude image, a phase image, or k-space data.

In some embodiments, to determine one or more characteristics associated with a body part of the subject from the image data, the at least one processor may be further configured to cause the system to perform the operations including determining the one or more characteristics associated the body part from the image data using a trained machine learning model.

In some embodiments, the trained machine learning model may be provided by a process including obtaining a plurality of training samples, each of the plurality of training samples including an image, and generating the trained machine learning model by iteratively updating, based on the plurality of training samples, parameter values of a machine learning model.

In some embodiments, the iteratively updating, based on the plurality of training samples, parameter values of a machine learning model may include performing an iterative process. Each iteration of the iterative process may include one or more of the following operations. The system may input at least one training sample of the plurality of training samples into the machine learning model. The system may generate, based on the at least one training sample, an estimated output using the machine learning model. The system may obtain an assessment result by assessing a difference between the estimated output and a reference output corresponding to the at least one training sample. The system may determine whether a termination condition is satisfied. The system may update, based on the assessment result, at least some of the parameter values of the machine learning model in response to the determination that the termination condition is not satisfied, or designate the machine learning model with the parameter values updated in a last iteration as the trained machine learning model in response to the determination that the termination condition is satisfied.

In some embodiments, the obtaining an assessment result by assessing a difference between the estimated output and a reference output may include determining a value of a cost function relating to the difference between the estimated output and the reference output. The termination condition may relate to a cost function or an iteration count of the iterative process.

In some embodiments, the one or more individualized parameters may include one or more calibration parameters associated with a main magnetic field of the imaging device.

In some embodiments, the one or more calibration parameters associated with the main magnetic field may include at least one of a calibration parameter of a shimming sequence or a calibration parameter of a shimming algorithm.

In some embodiments, the calibration parameter of the shimming sequence may include at least one of a field of view (FOV) or a spatial resolution corresponding to the main magnetic field of the imaging device.

In some embodiments, the calibration parameter of the shimming algorithm may include a shimming portion of the subject that needs to be optimized using the shimming algorithm.

In some embodiments, to determine, based on one or more characteristics of the body part, values of one or more individualized parameters corresponding to the subject, the at least one processor may be configured to cause the system to perform the operations including determining, based on the position information and the geometric morphology information of the body part, the one or more calibration parameters associated with the main magnetic field.

In some embodiments, the one or more individualized parameters may include one or more calibration parameters associated with a radiofrequency field of the imaging device.

In some embodiments, the one or more calibration parameters associated with the radiofrequency field may include at least one of a calibration parameter of a transmitting mode of the radiofrequency field or a calibration parameter of a radiofrequency pulse sequence.

In some embodiments, the calibration parameter of the transmitting mode may include at least one of an amplitude or a phase.

In some embodiments, the calibration parameter of the radiofrequency pulse sequence may include at least one of an FOV corresponding to the radiofrequency pulse sequence or an initial value of radiofrequency transmitting gain associated with the radiofrequency pulse sequence.

In some embodiments, to determine, based on one or more characteristics of the body part, values of one or more individualized parameters corresponding to the subject, the at least one processor may be configured to cause the system to perform the operations including obtaining prior knowledge associated with the radiofrequency field, and determining, based on the prior knowledge and the one or more characteristics of the body part, values of the one or more calibration parameters associated with the radiofrequency field of the imaging device.

In some embodiments, the one or more personalized parameters may include resonance frequencies of different portions of the body part.

In some embodiments, to determine, based on one or more characteristics of the body part, values of one or more individualized parameters corresponding to the subject, the at least one processor is configured to cause the system to perform the operations including determining, based on one or more characteristics of the body part, a frequency calibration model, and determining, based on the frequency calibration model, the resonance frequencies of different portions of the body part.

In some embodiments, the one or more individualized parameters may include one or more calibration parameters associated with an image of at least a portion of the subject.

In some embodiments, a calibration parameter associated with an image may include at least one of a calibration parameter associated with a normalization sequence of uniformity of the image or a calibration parameter associated with a normalization algorithm of the uniformity of the image.

In some embodiments, the calibration parameter associated with the normalization sequence may include at least one of an FOV or a resolution of the normalization sequence.

In some embodiments, the calibration parameter associated with the normalization algorithm of the uniformity of the image may include at least one of one or more filtering parameters associated with the image or a threshold associated with a signal to noise ratio (SNR) of the image.

In some embodiments, the at least one processor may be further configured to cause the system to perform the operations including monitoring, based on the one or more characteristics of the body part, one or more physiological parameters of the subject in the imaging scan.

In some embodiments, to monitor, based on one or more characteristics of the body part, one or more physiological parameters of the subject in the imaging scan, the at least one processor may be further configured to cause the system to perform the operations including obtaining, based on one or more characteristics of the body part of the subject, a physiological parameter model, and determining values of at least one of the one or more physiological parameters corresponding to one or more portions of the subject using the physiological parameter model.

In some embodiments, the physiological parameter may include at least one of a specific absorption ratio (SAR) or a peripheral nerve stimulation (PNS).

According to a second aspect of the present disclosure, a method is provided. The method may include obtaining image data of a subject acquired by an imaging device. The method may further include determining one or more characteristics associated with a body part of the subject from the image data. The one or more characteristics of the body part of the subject may include at least one of position information of the body part in the subject, geometric morphology information of the body part, water content information, or fat content information. The method may further include determining, based on one or more characteristics associated with the body part, values of one or more individualized parameters corresponding to the subject. The method may include causing the imaging device to perform an imaging scan on the subject according to the values of the one or more individualized parameters.

According to a third aspect of the present disclosure, a non-transitory readable medium is provided. The non-transitory readable medium may include at least one set of instructions. When executed by at least one processor, the at least one set of instructions may direct the at least one processor to perform a method. The method may include obtaining image data of a subject acquired by an imaging device. The method may further include determining one or more characteristics associated with a body part of the subject from the image data. The one or more characteristics of the body part of the subject may include at least one of position information of the body part in the subject, geometric morphology information of the body part, water content information, or fat content information. The method may further include determining, based on one or more characteristics associated with the body part, values of one or more individualized parameters corresponding to the subject. The method may include causing the imaging device to perform an imaging scan on the subject according to the values of the one or more individualized parameters.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
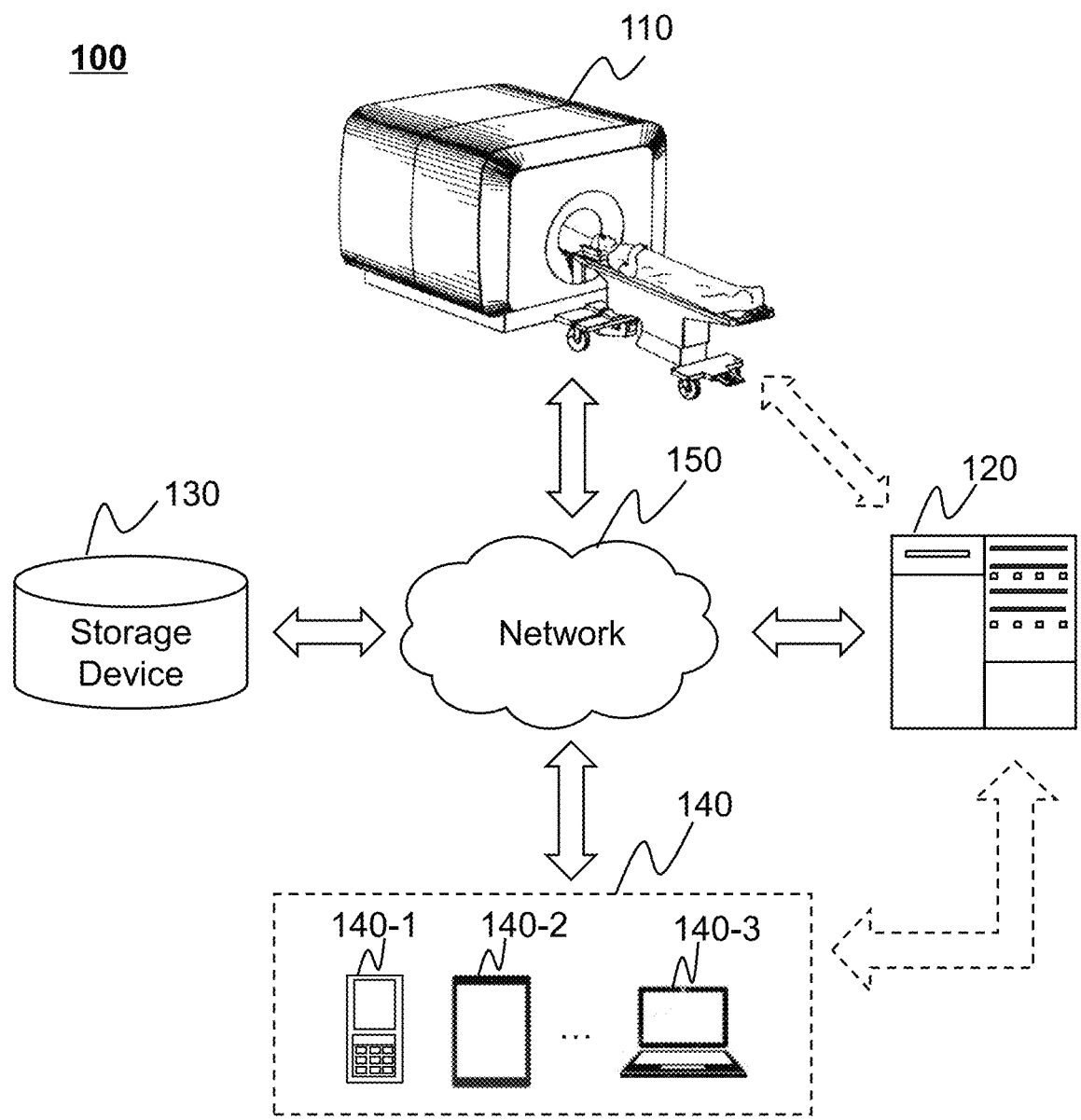
FIG. 1 is a schematic diagram illustrating an exemplary imaging system according to some embodiments of the present disclosure.

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown but is to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including" when used in this disclosure, specify the presence of stated features, integers, steps, operations, elements, and/or components, but do not preclude the presence or addition of one or more other features, integers, steps, operations, elements, components, and/or groups thereof.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage devices. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an erasable programmable read-only memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that the term "system," "engine," "unit," "module," and/or "block" used herein are one method to distinguish different components, elements, parts, sections or assembly of different levels in ascending order. However, the terms may be displaced by another expression if they achieve the same purpose.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in an inverted order, or simultaneously. Moreover, one or more other operations may be added to the flowcharts. One or more operations may be removed from the flowcharts.

Provided herein are systems and methods for imaging. A system may include at least one storage device storing executable instructions, and at least one processor in communication with the at least one storage device. When executing the executable instructions, the at least one processor may cause the system to obtain image data of a subject acquired by an imaging device. In some embodiments, the imaging device may include a magnetic resonance scanner, and the image data may be acquired by the imaging device via scanning the subject according to a fast pulse sequence. The at least one processor may cause the system to determine one or more characteristics of a body part of the subject from the image data. For example, the system may identify the one or more characteristics the body part from the image data using a trained machine learning model. The at least one processor may cause the system to determine, based on the one or more characteristics of the body part, one or more individualized parameters corresponding to the subject. In some embodiments, the at least one processor may cause the imaging device to perform an imaging scan on the subject according to the one or more individualized parameters. Accordingly, the one or more individualized parameters determined based on the characteristics of the body part of a subject may be determined for the imaging of the subject, which may improve the accuracy and/or quality of image data acquired by the imaging device via scanning the subject according to the individualized parameters.

FIG. 1 is a schematic diagram illustrating an exemplary imaging system according to some embodiments of the present disclosure. In some embodiments, the imaging system 100 may be a single-modality system or a multi-modality system. Exemplary single-modality systems may include a magnetic resonance imaging (MRI) system, a magnetic resonance spectroscopy (MRS) system, a positron emission tomography (PET) system, a computed tomography (CT) system, etc. Exemplary multi-modality systems may include a magnetic resonance-positron emission tomography (MR-PET) system, a positron emission tomography-computed tomography (PET-CT) system, etc. In some embodiments, the imaging system 100 may include modules and/or components for performing imaging calibration and/or related analysis.

Merely by way of example, as illustrated in FIG. 1, the imaging system 100 may include an imaging device 110, a processing device 120, a storage device 130, one or more terminals 140, and a network 150. The components in the imaging system 100 may be connected in one or more of various ways. Merely by way of example, the imaging device 110 may be connected to the processing device 120 through the network 150. As another example, the imaging device 110 may be connected to the processing device 120 directly as illustrated in FIG. 1. As a further example, the terminal(s) 140 may be connected to another component of the imaging system 100 (e.g., the processing device 120) via the network 150. As still a further example, the terminal(s) 140 may be connected to the processing device 120 directly as illustrated by the dotted arrow in FIG. 1. As still a further example, the storage device 130 may be connected to another component of the imaging system 100 (e.g., the processing device 120) directly as illustrated in FIG. 1, or through the network 150.

The imaging device 110 may be configured to acquire image data relating to at least one part of a subject. The image data relating to at least one part of a subject may include an image (e.g., an image slice), projection data, or a combination thereof. For example, the image data of the subject may include a scout image associated with a body part of the subject. In some embodiments, the image data may be a two-dimensional (2D) imaging data, a three-dimensional (3D) imaging data, a four-dimensional (4D) imaging data, or the like, or any combination thereof. The subject may be biological or non-biological. For example, the subject may include a patient, a man-made object, etc. As another example, the subject may include a specific portion, organ, and/or tissue of the patient. For example, the subject may include the head, a hand, the neck, the thorax, the heart, the stomach, a blood vessel, soft tissue, a tumor, nodules, an arm, a leg, the pelvic cavity, or the like, or any combination thereof.

In some embodiments, the imaging device 110 may include a single modality imaging device. For example, the imaging device 110 may include a magnetic resonance spectroscopy (MRS) device, a magnetic resonance imaging (MRI) device (also referred to as an MR device, an MR scanner), a positron emission tomography (PET) device, an emission computed tomography (ECT) device, a computed tomography (CT) device, an ultrasound device, or the like, or any combination thereof. In some embodiments, the imaging device 110 may include a multi-modality imaging device. Exemplary multi-modality imaging devices may include an MRI-CT device, PET-CT device, a PET-MR device, or the like, or a combination thereof.

The processing device 120 may process data and/or information obtained from the imaging device 110, the storage device 130, and/or the terminal(s) 140. For example, the processing device 120 may obtain image data of a subject acquired by the imaging device 110. As another example, the processing device 120 may determine one or more characteristics of a body part of the subject from the image data, and determine one or more individualized parameters corresponding to the subject based on one or more characteristics of the body part. The processing device 120 may perform an imaging scan on the subject according to the one or more individualized parameters.

In some embodiments, the processing device 120 may be a computer, a user console, a single server or a server group, etc. The server group may be centralized or distributed. In some embodiments, the processing device 120 may be local or remote. For example, the processing device 120 may access information and/or data stored in the imaging device 110, the terminal(s) 140, and/or the storage device 130 via the network 150. As another example, the processing device 120 may be directly connected to the imaging device 110, the terminal(s) 140 and/or the storage device 130 to access stored information and/or data. In some embodiments, the processing device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 130 may store data, instructions, and/or any other information. In some embodiments, the storage device 130 may store data obtained from the terminal(s) 140 and/or the processing device 120. For example, the storage device 130 may store image data (e.g., MRS images, MR images, etc.) acquired by the imaging device 110. As another example, the storage device 130 may store one or more algorithms for processing the image data, e.g., a trained machine learning model for image generation, etc. As still another example, the storage device 130 may store prior knowledge associated with a radiofrequency field. In some embodiments, storage device 130 may store data and/or instructions that the processing device 120 may execute or use to perform exemplary methods/systems described in the present disclosure. In some embodiments, the storage device 130 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the imaging system 100 (e.g., the processing device 120, the terminal(s) 140, etc.). One or more components in the imaging system 100 may access the data or instructions stored in the storage device 130 via the network 150. In some embodiments, the storage device 130 may be directly connected to or communicate with one or more other components in the imaging system 100 (e.g., the processing device 120, the terminal(s) 140, etc.). In some embodiments, the storage device 130 may be part of the processing device 120 or the imaging device 110.

In some embodiments, a user and/or an operator may operate the imaging system 100 using the terminal(s) 140. The terminal(s) 140 may include a mobile device 140-1, a tablet computer 140-2, a laptop computer 140-3, or the like, or any combination thereof. In some embodiments, the mobile device 140-1 may include a smart home device, a wearable device, a mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, a footgear, eyeglasses, a helmet, a watch, clothing, a backpack, a smart accessory, or the like, or any combination thereof. In some embodiments, the mobile device may include a mobile phone, a personal digital assistant (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™ a Gear VR™, etc. In some embodiments, the terminal(s) 140 may be part of the processing device 120.

The network 150 may include any suitable network that can facilitate the exchange of information and/or data for the imaging system 100. In some embodiments, one or more components of the imaging device 110 (e.g., an MR device, etc.), the terminal(s) 140, the processing device 120, the storage device 130, etc., may communicate information and/or data with one or more other components of the imaging system 100 via the network 150. For example, the processing device 120 may obtain data from the imaging device 110 via the network 150. As another example, the processing device 120 may obtain user instructions from the terminal(s) 140 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the imaging system 100 may be connected to the network 150 to exchange data and/or information.

It should be noted that the above description of the imaging system 100 is merely provided for the purposes of illustration, and not intended to limit the scope of the present disclosure. For persons having ordinary skills in the art, multiple variations and modifications may be made under the teachings of the present disclosure. For example, the assembly and/or function of the imaging system 100 may be varied or changed according to specific implementation scenarios.

Figure 2:
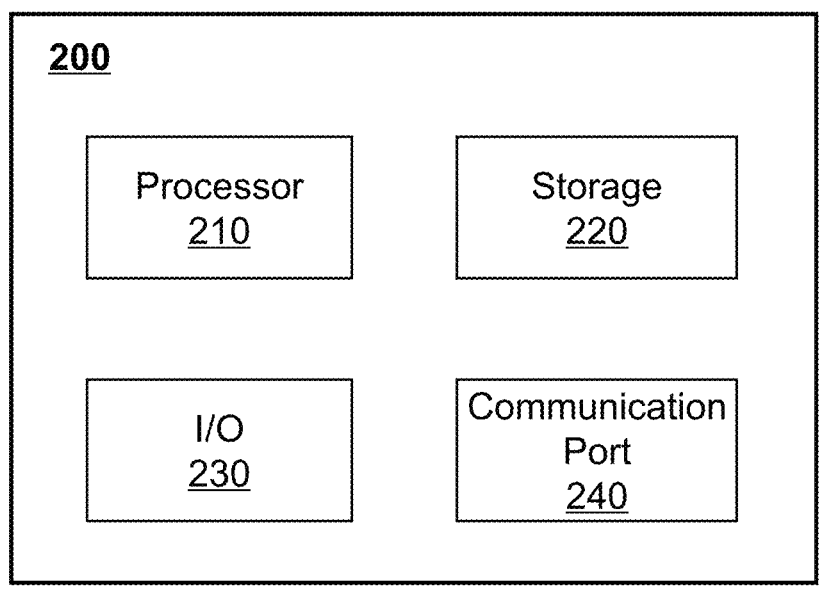
FIG. 2 is a schematic diagram illustrating hardware and/or software components of an exemplary computing device according to some embodiments of the present disclosure.

FIG. 2 is a schematic diagram illustrating hardware and/or software components of an exemplary computing device 200 on which the processing device 120 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program codes) and perform functions of the processing device 120 in accordance with techniques described herein. The computer instructions may include, for example, routines, programs, objects, components, signals, data structures, procedures, modules, and functions, which perform particular functions described herein. For example, the processor 210 may cause an imaging device to perform an imaging scan on a subject according to one or more individualized parameters. As another example, the processor 210 may generate a trained machine model based on a plurality of training samples by iteratively updating parameter values of a machine learning model. In some embodiments, the processor 210 may include one or more hardware processors, such as a microcontroller, a microprocessor, a reduced instruction set computer (RISC), an application-specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field-programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

The storage 220 may store data/information obtained from the imaging device 110, the terminal(s) 140, the storage device 130, or any other component of the imaging system 100. In some embodiments, the storage 220 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 120 to perform an imaging scan on the subject.

The I/O 230 may input or output signals, data, and/or information. In some embodiments, the I/O 230 may enable user interaction with the processing device 120. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected with a network (e.g., the network 150) to facilitate data communications. The communication port 240 may establish connections between the processing device 120 and the imaging device 110, the terminal(s) 140, or the storage device 130. The connection may be a wired connection, a wireless connection, or a combination of both that enables data transmission and reception. The wired connection may include an electrical cable, an optical cable, a telephone wire, or the like, or any combination thereof. The wireless connection may include a Bluetooth network, a Wi-Fi network, a WiMax network, a WLAN, a ZigBee network, a mobile network (e.g., 3G, 4G, 5G, etc.), or the like, or any combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
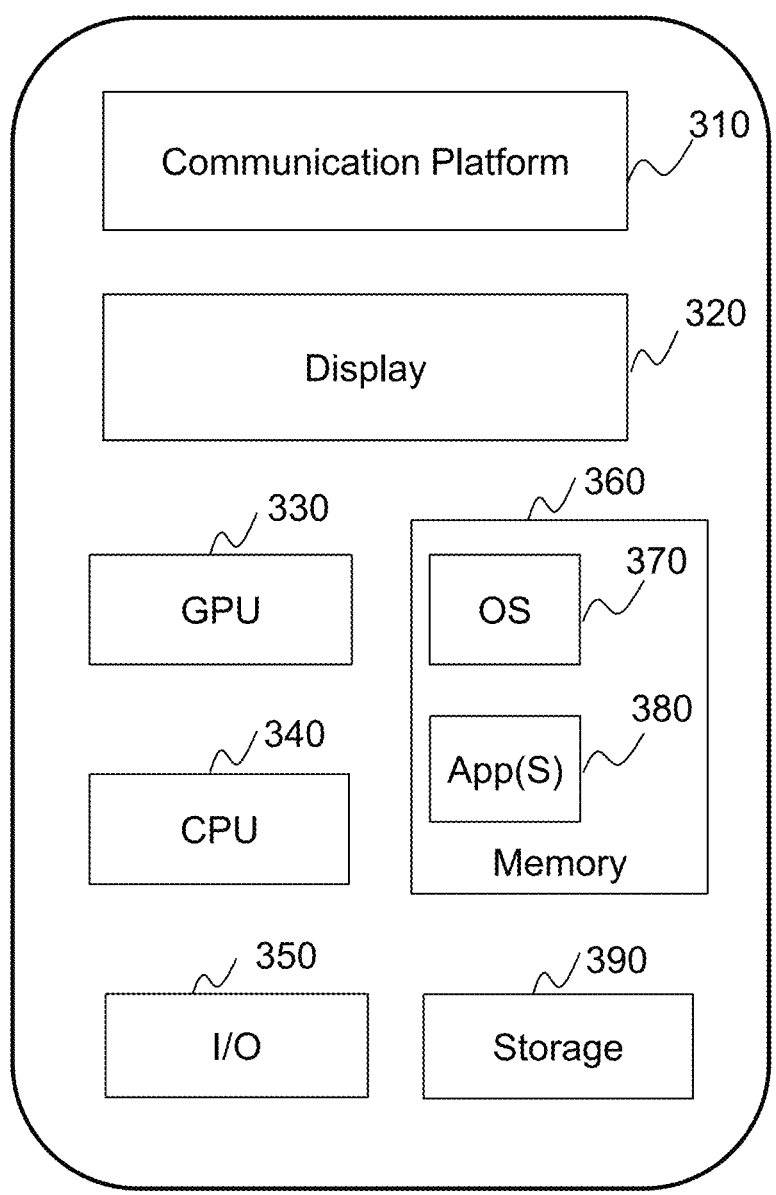
FIG. 3 is a schematic diagram illustrating hardware and/or software components of an exemplary mobile device according to some embodiments of the present disclosure.

FIG. 3 is a schematic diagram illustrating hardware and/or software components of an exemplary mobile device 300 according to some embodiments of the present disclosure. As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 120. User interactions with the information stream may be achieved via the I/O 350 and provided to the processing device 120 and/or other components of the imaging system 100 via the network 150.

To implement various modules, units, and functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result, the drawings should be self-explanatory.

Figure 4A:
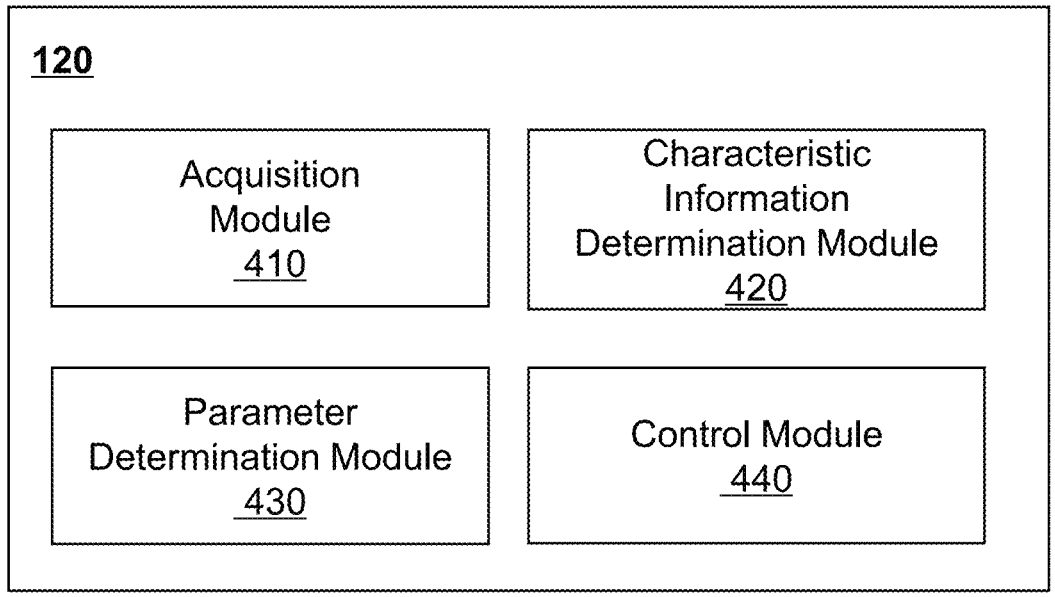
FIG. 4A is a block diagram illustrating an exemplary processing device according to some embodiments of the present disclosure.

FIG. 4A is a block diagram illustrating an exemplary processing device according to some embodiments of the present disclosure. In some embodiments, processing device 120 may be implemented on a computing device 200 (e.g., the processor 210) illustrated in FIG. 2 or a CPU 340 as illustrated in FIG. 3. As illustrated in FIG. 4, the processing device 120 may include an acquisition module 410, a characteristics information determination module 420, a parameter determination module 430, and a control module 440. Each of the modules described above may be a hardware circuit that is designed to perform certain actions, e.g., according to a set of instructions stored in one or more storage media, and/or any combination of the hardware circuit and the one or more storage media.

The acquisition module 410 may be configured to obtain data (e.g., image data, models, prior knowledge, etc.) used in a process for MRI. For example, the acquisition module 410 may obtain image data of a subject acquired by an imaging device. In some embodiments, the acquisition module 410 may obtain the image data from a storage device, for example, the storage device 130, or any other storage (not shown). In some embodiments, the imaging device may include a magnetic resonance (MR) scanner. In some embodiments, the image data of the subject may include an amplitude image, a phase image, k-space data, projection data, etc. The image data acquired by the imaging device may include pre-scanning data, a scout image (or a scout image), a diagnostic image, etc. As another example, the acquisition module 410 may obtain a trained machine learning model for body part identification.

The characteristic information determination module 420 may be configured to determine one or more characteristics of a body part of the subject from the image data. The image data may include a representation of at least a portion of the subject. As used herein, the identification of a body part from image data may refer to the detection of the body part from the image data and/or recognize information of the body part from the image. The information of the body part may be indicative of one or more characteristics of the body part. The one or more characteristics of the body part may include the geometric morphology of the body part, the contour or boundary of the body part, the part or position (e.g., the head, the abdomen, the heart, a breast, etc.) of the body part in the subject, types of one or more tissues of the body part (e.g., bone, blood, etc.), water and/or fat content information of the subject (e.g., a water proportion or content in the subject or the body part, a fat proportion or content in the subject or the body part), etc. The geometric morphology of the body part may include the size of the body part, a geometric shape of the body part, obese or thin, etc.

In some embodiments, the characteristic information determination module 420 may identify the body part using an object determination model, e.g., a trained machine learning model, an image segmentation technique.

The parameter determination module 430 may be configured to determine, based on one or more characteristics of the body part, values of one or more individualized parameters corresponding to the subject. In some embodiments, the one or more individualized parameters may include calibration parameters associated with one or more components of the imaging device and/or one or more portions of the body part. The calibration parameters may include one or more calibration parameters associated with a radiofrequency (RF) field (also referred to as RF transmitting field) of an MR scanner, one or more calibration parameters associated with a main magnetic field (also referred to as B0 magnetic field) of the MR scanner, one or more calibration parameters associated with resonance frequencies of different portions or components of the body part, one or more calibration parameters associated with an MR image, etc.

The parameter determination module 430 may be configured to monitor, based on one or more characteristics of the body part, one or more physiological parameters of the subject in the imaging scan. The one or more physiological parameters may include a specific absorption ratio (SAR), a peripheral nerve stimulation (PNS), etc. In some embodiments, the processing device 120 may obtain a physiological parameter model based on the one or more characteristics of the body part of the subject. The physiological parameter model may include a SAR distribution model, a PNS model, etc. The physiological parameter model may reflect or correspond to a relationship between values of physiological parameters corresponding to one or more portions of the subject.

The control module 440 may be configured to cause an imaging device to perform an imaging scan on the subject according to the one or more individualized parameters. For example, the control module 440 may cause the imaging device to scan a subject according to a fast pre-scanning sequence. As another example, the control module 440 may cause the imaging device to scan a subject according to an imaging scan sequence. In some embodiments, the control module 440 may perform one or more operations on the imaging device according to the one or more individualized parameters. The one or more operations may include calibrating the radiofrequency field, calibrating the main magnetic field, calibrating the resonance frequencies, or the like, or any combination thereof.

It should be noted that the above description is merely provided for the purposes of illustration, and not intended to limit the scope of the present disclosure. Apparently, for persons having ordinary skills in the art, multiple variations and modifications may be conducted under the teachings of the present disclosure. However, those variations and modifications do not depart from the scope of the present disclosure. For example, the parameter determination module 430 and the control module 440 may be integrated into a single module. As another example, some other components/modules may be added into the processing device 120. For example, the processing device 120 may further include a storage device for storing data.

Figure 4B:
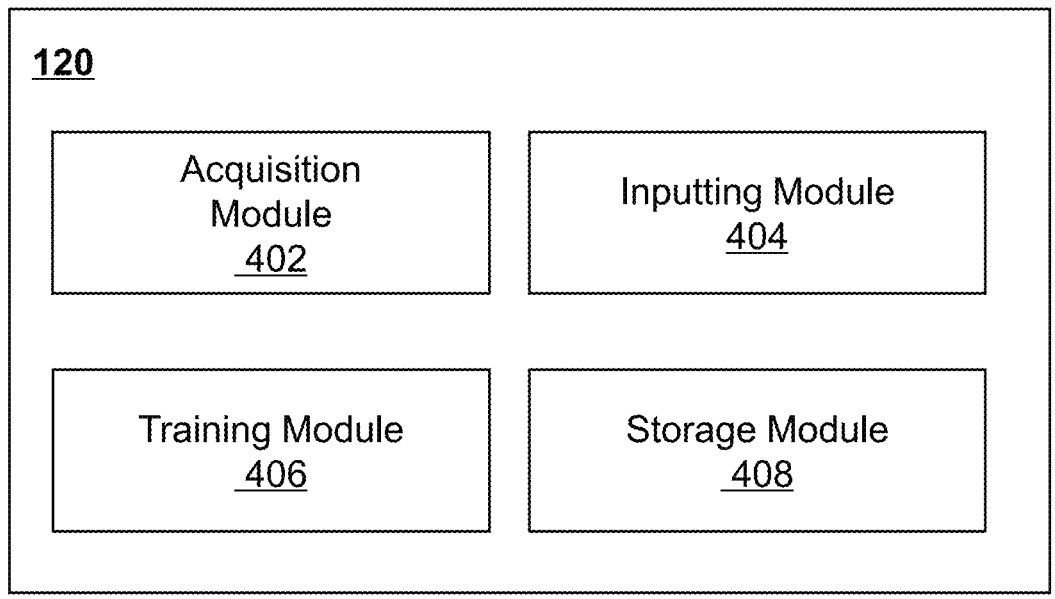
FIG. 4B is a block diagram illustrating another exemplary processing device according to some embodiments of the present disclosure.

FIG. 4B is a block diagram illustrating another exemplary processing device according to some embodiments of the present disclosure. In some embodiments, processing device 120 may be implemented on a computing device 200 (e.g., the processor 210) illustrated in FIG. 2 or a CPU 340 as illustrated in FIG. 3. As illustrated in FIG. 4, the processing device 120 may include an acquisition module 402, an inputting module 404, a training module 406, and a storage module 408. Each of the modules described above may be a hardware circuit that is designed to perform certain actions, e.g., according to a set of instructions stored in one or more storage media, and/or any combination of the hardware circuit and the one or more storage media.

The acquisition module 402 may be configured to obtain a plurality of training samples. In some embodiments, each of the plurality of training samples may include image data acquired by an imaging device and a reference result (e.g., the body part) corresponding to the image data. The reference result may indicate the part of the body (e.g., the body part) being scanned. In some embodiments, the reference result may be obtained by annotating (e.g., manually) the image data. For example, a body part may be identified from the image data manually by describing a boundary of the body part in the image data. In some embodiments, the image data of a training sample may be acquired by an imaging device via scanning a subject (e.g., the body of a human (e.g., a volunteer), a phantom, etc.) according to a fast pulse sequence. Alternatively, the plurality of training samples may include amplitude image data (e.g., an amplitude image) obtained by performing Fourier transform on the image data (e.g., an MR image) acquired by the imaging device. In some embodiments, a training sample may include phase image or k-space data.

The inputting module 404 may be configured to input at least one training sample of the plurality of training samples into the machine learning model. In some embodiments, the machine learning model may include a supervised learning model, a semi-supervised learning model, an unsupervised learning model, or the like. In some embodiments, the machine learning model may be constructed based on a deep learning model. Exemplary deep learning models may include at least one of a convolutional neural network (CNN) model, a fully convolutional neural network (FCN) model, a generative adversarial network (GAN) model, a backpropagation (BP) machine learning model, a radial basis function (RBF) model, a deep belief nets (DBN) model, an Elman model, or the like, or a combination thereof.

The training module 406 may be configured to perform an iterative process that may be repeated with respect to a plurality of training samples to improve or optimize the machine learning model until a termination condition is satisfied. For example, the training module 406 may generate, based on the at least one training sample, an estimated output using the machine learning model. The training module 406 may obtain an assessment result by assessing a difference between the estimated output and a reference output corresponding to the inputted training sample. The training module 406 may update, based on the assessment result, at least some of the parameter values of the machine learning model. The training module 406 may designate the machine learning model with the parameter values updated in a last iteration as the trained machine learning model.

In different rounds the iterative process, different training samples may be inputted into the machine learning model. In some embodiments, the termination condition may be that a specific number of training samples have been analyzed. In some embodiments, the termination condition may be that a specific number of iterations have been performed.

The storage module 408 may be configured to store data and/or instructions associated with the imaging system 100. For example, the storage module 408 may store data of training samples, one or more machine learning models, the trained machine learning model, etc. In some embodiments, the storage module 408 may be the same as the storage device 130 in configuration.

It should be noted that the above description is merely provided for the purposes of illustration, and not intended to limit the scope of the present disclosure. Apparently, for persons having ordinary skills in the art, multiple variations and modifications may be conducted under the teachings of the present disclosure. However, those variations and modifications do not depart from the scope of the present disclosure. For example, the inputting module 404 and the training module 406 may be integrated into a single module. As another example, some other components/modules may be added into the processing device 120.

Figure 5:
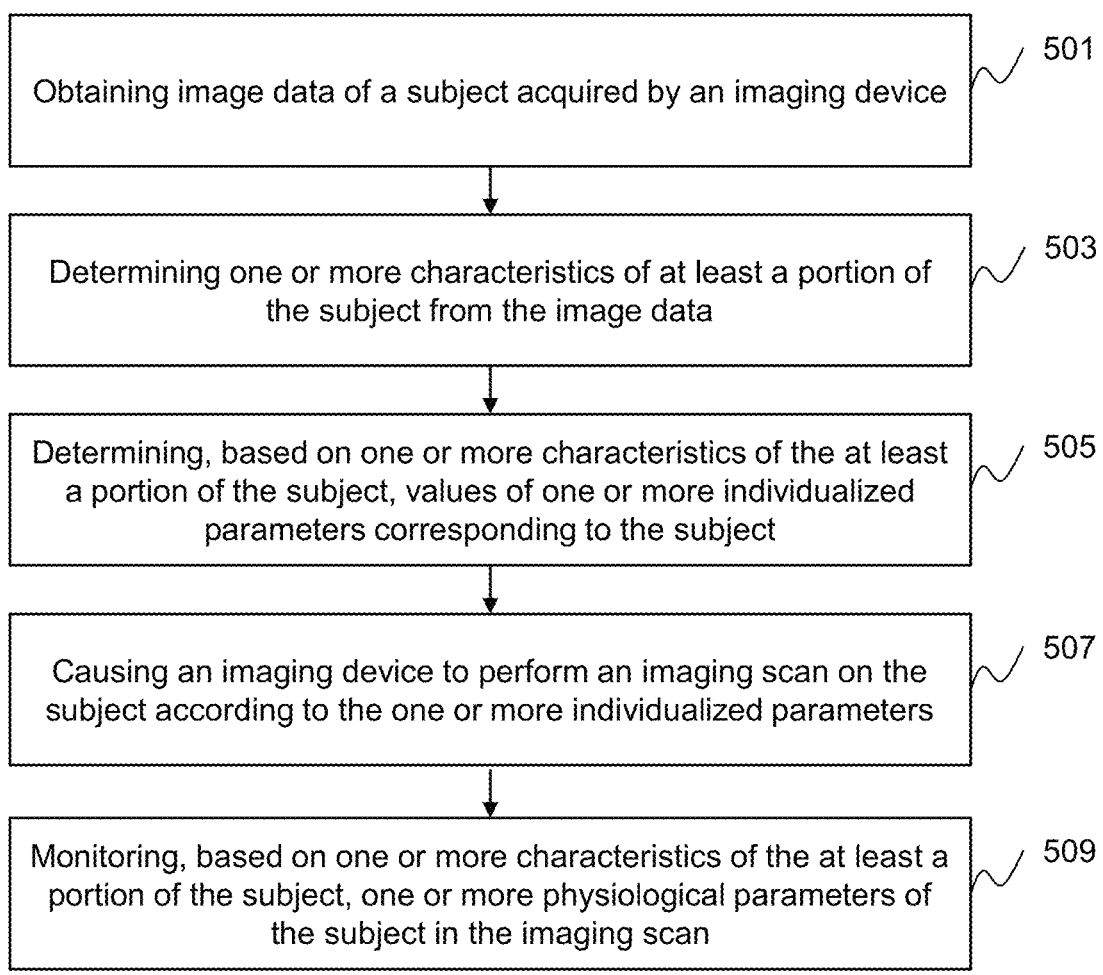
FIG. 5 is a flowchart illustrating an exemplary process for magnetic resonance imaging according to some embodiments of the present disclosure.

FIG. 5 is a flowchart illustrating an exemplary process for magnetic resonance imaging according to some embodiments of the present disclosure. In some embodiments, process 500 may be implemented as a set of instructions (e.g., an application) stored in the storage device 130, storage 220, or storage 390. The processing device 120, the processor 210 and/or the CPU 340 may execute the set of instructions, and when executing the instructions, the processing device 120, the processor 210 and/or the CPU 340 may be configured to perform the process 500. The operations of the illustrated process presented below are intended to be illustrative. In some embodiments, the process 500 may be accomplished with one or more additional operations not described and/or without one or more of the operations discussed. Additionally, the order of the operations of the process 500 illustrated in FIG. 5 and described below is not intended to be limiting.

In 501, the processing device 120 (e.g., the acquisition module 410) may obtain image data of a subject acquired by an imaging device. The subject may be biological or non-biological. For example, the subject may include a patient, a man-made object, etc. As another example, the subject may include a specific portion, organ, and/or tissue of the patient. For example, the subject may include the head, the neck, the thorax, the heart, the abdomen, the stomach, the limbs, the pelvic, a blood vessel, soft tissue, a tumor, nodules, or the like, or any combination thereof.

In some embodiments, the processing device 120 may obtain the image data from a storage device, for example, the storage device 130, or any other storage (not shown). The image data may be acquired by an imaging device (e.g., the imaging device 110). In some embodiments, the imaging device may include a magnetic resonance (MR) scanner. In some embodiments, the image data of the subject may include an amplitude image, a phase image, k-space data, projection data, etc. The image data acquired by the imaging device may include pre-scanning data, a scout image (or a scout image), a diagnostic image, etc.

In some embodiments, the pre-scanning data may be acquired by the imaging device via scanning the subject according to a fast pre-scanning sequence (also referred to as a fast pre-scanning pulse sequence). Exemplary fast pre-scanning sequences may include a low-resolution magnetic resonance sequence, a fast pulse sequence, etc. For example, the fast pulse sequence may include a 3D gradient recalled echo (GRE) sequence, a single shot fast spin echo (SSFSE) sequence, etc.

In some embodiments, the scout image may be acquired by the imaging device via scanning the subject according to a positioning scanning technique. Exemplary positioning scanning techniques may include using camera imaging, infrared imaging, a positioning scanning sequence (e.g., a low-resolution magnetic resonance sequence), etc.

In some embodiments, the diagnostic image may be acquired by the imaging device (e.g., an MR scanner) via scanning the subject according to an imaging sequence (e.g., a spin echo (SE) sequence, a fast SE sequence, an echo planer imaging (EPI) sequence, etc.). The diagnostic image may be a historical image acquired by the imaging device via scanning the same subject and stored in the storage device, for example, the storage device 130, or any other storage (not shown).

In 503, the processing device 120 (e.g., the characteristic information determination module 420) may determine one or more characteristics of at least a portion of the subject (e.g., a body part of the subject or the subject) from the image data. The image data may include a representation of the at least a portion of the subject. In some embodiments, the processing device 120 may identify the at least a portion of the subject from the image data (e.g., an MR image). As used herein, the identification of at least a portion of the subject from an image may refer to the detection of the at least a portion of the subject from the image and/or recognize information of the at least a portion of the subject from the image. The information of the at least a portion of the subject may be indicative of one or more characteristics of the at least a portion of the subject. The one or more characteristics of the at least a portion of the subject may include the contour or boundary of the at least a portion of the subject, the part or position (e.g., the head, the abdomen, the heart, a breast, etc.) information of the at least a portion of the subject in the subject, types of one or more tissues of the at least a portion of the subject (e.g., bone, blood, etc.), the geometric morphology information (e.g., obese or thin, the geometric shape of the at least a portion of the subject, the size of the at least a portion of the subject, etc.) of the at least a portion of the subject, water and/or fat content information of the at least a portion of the subject, etc. As used herein, the position (e.g., the head, the abdomen, the heart, a breast, etc.) information of the at least a portion of the subject in the subject refers to a body part where the at least a portion of the subject belongs to in the subject. The water and/or fat content information may include at least one of fat content information or water content information. For example, the water and/or fat content information of at least a portion of the subject may include a proportion of water in the at least a portion of the subject, a proportion of fat in the at least a portion of the subject, or combination thereof.

In some embodiments, the processing device 120 may determine the one or more characteristics of at least a portion of the subject (e.g., a body part) using an object determination model, e.g., a trained machine learning model, an image segmentation technique.

In some embodiments, the trained machine learning model may be reconstructed based on a convolutional neural network (CNN) model, a fully convolutional neural network (FCN) model, a generative adversarial network (GAN) model, a backpropagation (BP) machine learning model, a radial basis function (RBF) model, a deep belief nets (DBN) model, an Elman model, or the like, or a combination thereof. In some embodiments, the trained machine learning model may be obtained by a processing device that is the same as or different from the processing device 120. For example, the trained machine learning model may be trained by the processing device using one or more machine learning techniques, such as a supervised learning technique, an unsupervised learning technique, a semi-supervised learning technique, etc. More descriptions for determining the trained machine learning model may be found elsewhere in the present disclosure (e.g., FIG. 6 and the descriptions thereof).

In some embodiments, the processing device 120 may input the image data (e.g., an MR image) into the trained machine learning model. The trained machine learning model may be configured to locate and/or mark the at least a portion of the subject (e.g., a body part) in the inputted image data using, for example, a bounding box. The bounding box may refer to a box enclosing at least a portion of the detected at least a portion of the subject in the image data. The bounding box may be of any shape and/or size. For example, the bounding box may have the shape of a square, a rectangle, a triangle, a polygon, a circle, an ellipse, an irregular shape, or the like. As another example, the bounding box may conform to the boundary or contour of the at least a portion of the subject (e.g., a body part). In some embodiments, the bounding box may be a minimum bounding box of a shape (e.g., a rectangle, a square, a polygon, a circle, an ellipse) that completely encloses the detected at least a portion of the subject. As used herein, a minimum bounding box of a shape (e.g., a rectangle, a square, a polygon, a circle, an ellipse) that completely encloses a detected object of interest indicates that if a dimension of the minimum bounding box (e.g., the radius of a circle minimum bounding box, the length or width of a rectangular minimum bounding box, etc.) is reduced, at least a portion of the detected object of interest is outside the minimum bounding box. The trained machine learning model may be configured to output a result identifying at least a portion of the processed image data with a bounding box that marks the identified at least a portion of the subject.

In some embodiments, the processing device 120 may identify the at least a portion of the subject (e.g., a body part) using an image segmentation technique. Exemplary image segmentation techniques may include a region-based segmentation technique, an edge-based segmentation technique, a wavelet transform segmentation technique, a mathematical morphology segmentation technique, a genetic algorithm-based segmentation technique, or the like, or a combination thereof. The mathematical morphology segmentation may be based on a Hysen points enhanced model, a Hysen line enhanced model, a multiscale Gaussian template matching model, a multi-scale morphological filtering model, etc. The edge-based segmentation technique may be based on a differential operator (e.g., the Robert operator, the Sobel operator, the Prewitt operator, the Log operator, the Canny operator, etc.), a surface-based fitting, a boundary and surface-based fitting, a serial boundary searching, or the like, or a combination thereof.

In 505, the processing device 120 (e.g., the parameter determination module 430) may determine, based on the one or more characteristics of the at least a portion of the subject (e.g., a body part), values of one or more individualized parameters corresponding to the subject. For brevity, the term "parameter" or a specific term of this nature (e.g., radiofrequency, resonance frequency) may refer to a property (e.g., a physical property of a device, a field, etc.), a condition (e.g., a physical condition of a device or a field, a physiological condition of a subject) or an aspect of an operational setup (e.g., imaging) that describes, determines, or affect the characteristics and/or performance of the operation, or a value, or a distribution of values thereof. For instance, a calibration parameter associated with a main magnetic field may refer to a parameter of a shimming operation for shimming the main magnetic field, or a value thereof. In some embodiments, the one or more individualized parameters may include calibration parameters associated with one or more components of the imaging device and/or one or more portions of the subject. The calibration parameters may include one or more calibration parameters associated with a radiofrequency (RF) field (also referred to as RF transmitting field) of an MR scanner, one or more calibration parameters associated with a main magnetic field (also referred to as B0 magnetic field) of the MR scanner, one or more calibration parameters associated with resonance frequencies of different portions or components of the at least a portion of the subject (e.g., a body part), one or more calibration parameters associated with an MR image to be reconstructed of the at least a portion of subject, etc.

In some embodiments, the one or more calibration parameters associated with the RF transmitting field may include a calibration parameter associated with an RF transmitting mode, a calibration parameter associated with an RF pulse sequence (also referred to as RF transmitting sequence) (e.g., sequence parameters), etc. For example, the one or more calibration parameters associated with the radiofrequency field may include an amplitude of the radiofrequency field, a phase of the radiofrequency field, a transmitting voltage, a channel coefficient of the radiofrequency field, an initial value of RF transmitting gain associated with the RF pulse sequence, the FOV of an RF pulse sequence, etc.

In some embodiments, the one or more calibration parameters associated with the main magnetic field may relate to the uniformity (or homogeneity) of the main magnetic field. The one or more calibration parameters associated with the main magnetic field may also be referred to as shimming parameters. Exemplary shimming parameters may include one or more calibration parameters of a shimming algorithm, one or more calibration parameters of a shimming sequence. For example, the one or more calibration parameters of a shimming sequence may include a field of view (FOV) (also referred to as shimming sequence FOV), a spatial resolution corresponding to the main magnetic field of the imaging device, the uniformity of the main magnetic field, etc. The one or more calibration parameters of a shimming algorithm may include the optimization or shimming portion of the subject that needs to be optimized using the shimming algorithm, i.e., a portion of the subject where the shimming algorithm needs to be applied. The one or more calibration parameters associated with the main magnetic field distributed with respect to the subject when the subject is located in the main magnetic field may influence each other. For example, the greater the shimming sequence FOV is, the poorer the uniformity of the main magnetic field may be. The poorer the uniformity of the main magnetic field, the lower the spatial resolution of a reconstructed MR image of the subject acquired by an MR scanner may be.

In some embodiments, the one or more calibration parameters associated with resonance frequencies of different portions of the at least a portion of the subject (e.g., a body part) may include one or more parameters associated with a frequency calibration algorithm, such as the number or count of components of a frequency spectrum, the intensity ratio of the components of the frequency spectrum, etc.

In some embodiments, the one or more calibration parameters associated with an MR image of the at least a portion of the subject to be reconstructed may include one or more sequence parameters associated with image uniformity calibration (also referred to as calibration parameters of a normalization sequence of the uniformity of the image), one or more algorithm parameters associated with image uniformity calibration (also referred to as calibration parameters of a normalization algorithm of the uniformity of the image), etc. For example, the sequence parameters associated with image uniformity calibration may include the FOV (also referred to as normalization sequence FOV) of a normalization sequence associated with image uniformity calibration, the resolution of a normalization sequence associated with image uniformity calibration, etc. The algorithm parameters associated with image uniformity calibration may include one or more filtering parameters, a threshold associated with a signal to noise ratio (SNR), etc. As used herein, the uniformity of an image acquired by an imaging device may be assessed based on a nonuniformity degree of the image. The greater the nonuniformity degree of the image is, the lower the uniformity of the image may be.

The processing device 120 may determine the value of a calibration parameter associated with the main magnetic field based on the one or more characteristics of the at least a portion of the subject (e.g., a body part). As used herein, the value of a calibration parameter associated with the main magnetic field refers to a desired value of the calibration parameter associated with the main magnetic field needed to generate the main magnetic field in which an imaging scan of a subject is performed. In some embodiments, the processing device 120 may determine the spatial resolution that is needed according to clinical demands or the type or size of the at least a portion of the subject (e.g., a body part). For example, the smaller the size of the at least a portion of the subject (e.g., a body part), the greater the spatial resolution may be. As another example, the greater the difference between densities of different portions in the at least a portion of the subject (e.g., a body part), the greater the spatial resolution may be. In some embodiments, the processing device 120 may determine the shimming sequence FOV according to the position and/or the boundary or contour of the at least a portion of the subject (e.g., a body part). For example, the determined shimming sequence FOV may completely enclose and/or substantially conform to the boundary or contour of the at least a portion of the subject (e.g., a body part), such that the main magnetic field distributed in the at least a portion of the subject (e.g., a body part) may be shimmed and/or optimized according to the shimming sequence. As used herein, a shimming sequence FOV substantially conforming to the boundary or contour of the at least a portion of the subject (e.g., a body part) indicates that a degree of deviation between the shimming sequence FOV and the at least a portion of the subject (e.g., a body part) (as defined by, e.g., the boundary or contour of the at least a portion of the subject (e.g., a body part) is below a threshold. The degree of deviation may be assessed based on, e.g., a ratio between a dimension (e.g., an area) of the portion of the at least a portion of the subject (e.g., a body part) that is outside the shimming sequence FOV to a corresponding dimension (e.g., the area) of the at least a portion of the subject (e.g., a body part), a similarity between the shape of the FOV and the shape of the at least a portion of the subject (e.g., a body part), etc. The threshold may be or less than 40%, less than 30%, less than 20%, less than 10%, etc.

In some embodiments, the processing device 120 may determine the uniformity of the main magnetic field based on the type of the at least a portion of the subject (e.g., a body part), the shimming sequence FOV determined based on the at least a portion of the subject (e.g., a body part), and/or the spatial resolution. As used herein, the uniformity of the main magnetic field may be assessed based on a nonuniformity degree. The lower the nonuniformity degree is, the greater the uniformity of the main magnetic field may be. For example, the greater the spatial resolution is, the lower the nonuniformity degree may be needed. The processing device 120 may need to adjust the nonuniformity degree of the main magnetic field according to a shimming technique to get the determined or a desired spatial resolution. Exemplary shimming techniques may include an active shimming technique, a passive shimming technique, or the like, or a combination thereof.

In some embodiments, to determine the one or more calibration parameters associated with an RF transmitting field of the imaging device, the processing device 120 may obtain prior knowledge associated with the radiofrequency field and determine the one or more calibration parameters associated with the RF transmitting field of the imaging device based on the prior knowledge and the one or more characteristics of the at least a portion of the subject (e.g., a body part). More descriptions for RF transmitting field calibration may be found elsewhere in the present disclosure (e.g., FIGS. 7 and 12, and the descriptions thereof).

In some embodiments, to determine the resonance frequencies of different portions of the at least a portion of the subject (e.g., a body part), the processing device 120 may determine a frequency calibration model according to the one or more characteristics of the at least a portion of the subject (e.g., a body part), and determine a calibrated spectrum curve of the at least a portion of the subject (e.g., a body part) based on the frequency calibration model. The processing device 120 may further determine the resonance frequencies of different portions of the at least a portion of the subject (e.g., a body part) based on the frequency calibration model. More descriptions for frequency calibration based on the one or more characteristics may be found elsewhere in the present disclosure (e.g., FIGS. 8 and 13, and the descriptions thereof).

In 507, the processing device 120 (e.g., the control module 440) may cause an imaging device to perform an imaging scan on the subject according to the one or more individualized parameters. The imaging device performing the imaging scan according to the one or more individualized parameters may be the same as or different from the imaging device for collecting the image data of the subject as described in operation 501. In some embodiments, the processing device 120 may perform one or more operations on the imaging device according to the one or more individualized parameters. The one or more operations may include calibrating the radiofrequency field, calibrating the main magnetic field, calibrating the resonance frequencies, or the like, or any combination thereof. When the one or more system parameters of the imaging device reach the one or more individualized parameters corresponding to the at least a portion of the subject (e.g., a body part), the imaging device may perform an imaging scan on the at least a portion of the subject (e.g., a body part). For example, the processing device 120 may calibrate the main magnetic field according to the calibration parameters associated with the main magnetic field. As a further example, the processing device 120 may adjust the uniformity of the main magnetic field based on the determined shimming sequence FOV and/or the determined nonuniformity degree using a shimming technique, such as an active shimming technique that uses coils carrying current to improve the uniformity of the main magnetic field within the shimming sequence FOV and/or imaging volume, a passive shimming technique that optimizes the layout of a series of shims (magnetic material) to improve the uniformity of the main magnetic field, etc.

In 509, the processing device 120 (e.g., the parameter determination module 430) may monitor, based on one or more characteristics of the at least a portion of the subject (e.g., a body part), one or more physiological parameters of the subject in the imaging scan. The one or more physiological parameters may include a specific absorption ratio (SAR), a peripheral nerve stimulation (PNS), etc. In some embodiments, the processing device 120 may obtain a physiological parameter model based on the one or more characteristics of the at least a portion of the subject (e.g., a body part)t. The physiological parameter model may include a SAR distribution model, a PNS model, etc. The physiological parameter model may reflect or correspond to a relationship between values of physiological parameters corresponding to one or more portions of the subject.

In some embodiments, different portions of a subject or different subjects may correspond to different physiological parameter models. The processing device 120 may determine the physiological parameter model of the subject based on the type of the at least a portion of the subject (e.g., a body part). The processing device 120 may determine the value of a physiological parameter in a portion of the subject that corresponds to the at least a portion of the subject (e.g., a body part) using the physiological parameter model. More descriptions for monitoring one or more physiological parameters of a subject in an imaging scan may be found elsewhere in the present disclosure (e.g., FIG. 9 and the descriptions thereof).

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, operation 507 and/or operation 509 may be omitted. As another example, one or more other optional operations (e.g., a storing operation) may be added elsewhere in the process 500.

Figure 6:
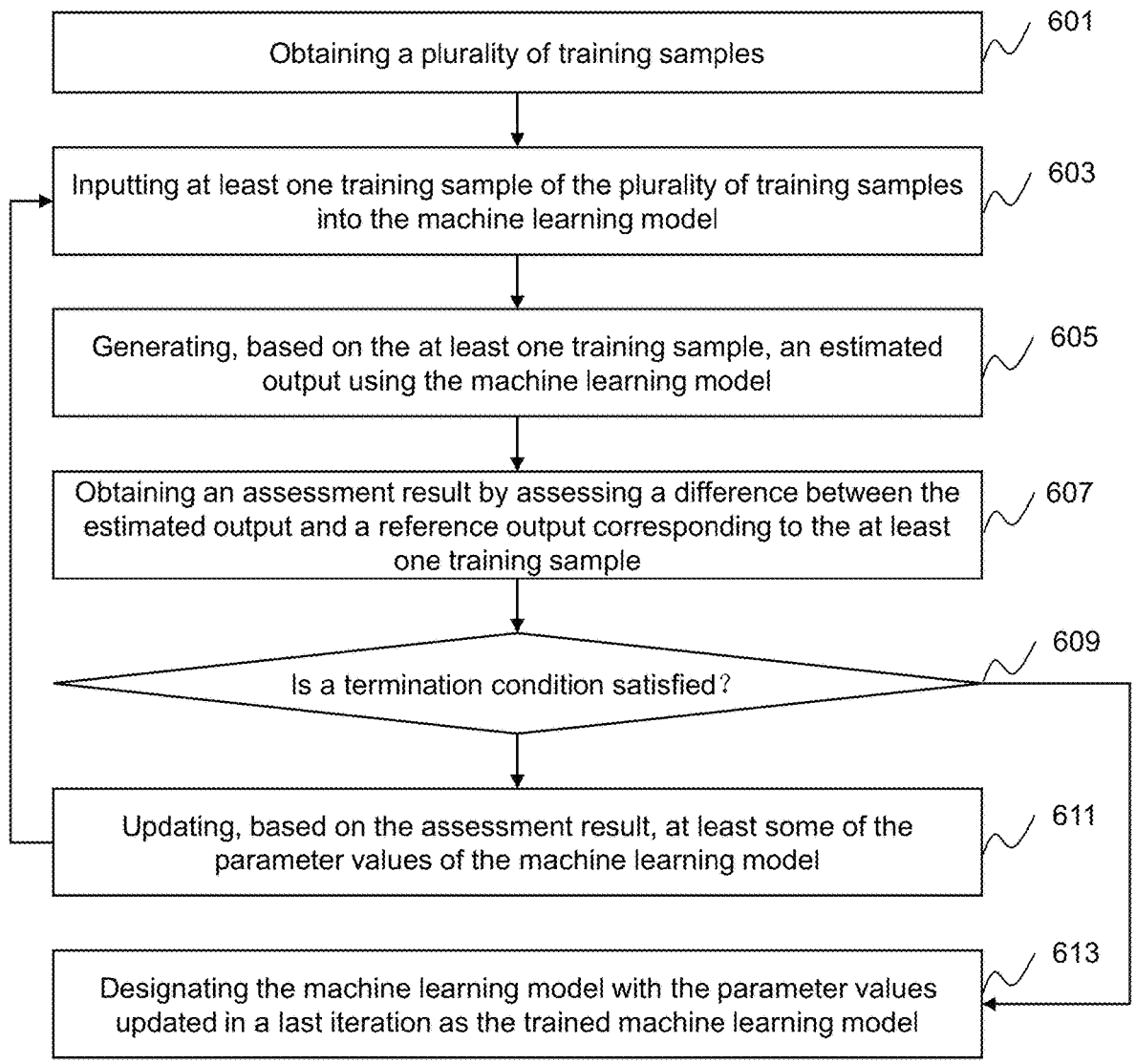
FIG. 6 is a flowchart illustrating an exemplary process for training a machine learning model according to some embodiments of the present disclosure.

FIG. 6 is a flowchart illustrating an exemplary process for determining a trained machine learning model for object identification according to some embodiments of the present disclosure. In some embodiments, process 600 may be implemented as a set of instructions (e.g., an application) stored in the storage device 130, storage 220, or storage 390. The processing device 120, the processor 210 and/or the CPU 340 may execute the set of instructions, and when executing the instructions, the processing device 120, the processor 210 and/or the CPU 340 may be configured to perform the process 600. The operations of the illustrated process presented below are intended to be illustrative. In some embodiments, the process 600 may be accomplished with one or more additional operations not described and/or without one or more of the operations discussed. Additionally, the order of the operations of the process 600 illustrated in FIG. 6 and described below is not intended to be limiting.

In 601, the processing device 120 (e.g., the acquisition module 402) may obtain a plurality of training samples. In some embodiments, each of the plurality of training samples may include image data acquired by an imaging device and a reference result (e.g., the body part) corresponding to the image data. The reference result may indicate the part of the body (e.g., the body part) being scanned. In some embodiments, the reference result may be obtained by annotating (e.g., manually) the image data. For example, a body part may be identified from the image data manually by describing a boundary of the body part in the image data. In some embodiments, the image data of a training sample may be acquired by an imaging device via scanning a subject (e.g., the body of a human (e.g., a volunteer), a phantom, etc.) according to a fast pulse sequence. The human may include an elderly, an adult, a child, a man, a woman, etc. Alternatively, the plurality of training samples may include amplitude image data (e.g., an amplitude image) obtained by performing Fourier transform on the image data (e.g., an MR image) acquired by the imaging device. In some embodiments, a training sample may include phase image or k-space data. In some embodiments, the processing device 120 may obtain the plurality of training samples from a storage device, for example, the storage device 130, or an external storage source (not shown).

In 603, the processing device 120 (e.g., the inputting module 404) may input at least one training sample of the plurality of training samples into the machine learning model. In some embodiments, the machine learning model may include a supervised learning model, a semi-supervised learning model, an unsupervised learning model, or the like. In some embodiments, the machine learning model may be constructed based on a deep learning model. Exemplary deep learning models may include at least one of a convolutional neural network (CNN) model, a fully convolutional neural network (FCN) model, a generative adversarial network (GAN) model, a backpropagation (BP) machine learning model, a radial basis function (RBF) model, a deep belief nets (DBN) model, an Elman model, or the like, or a combination thereof.

In 605, the processing device 120 (e.g., the training module 406) may generate, based on the at least one training sample, an estimated output using the machine learning model. In some embodiments, the machine learning model may extract image features from the inputted at least one training sample. The image features may include at least one of a low-level feature (e.g., an edge feature, a texture feature), a high-level feature (e.g., a semantic feature), or a complicated feature (e.g., a deep hierarchical feature). In some embodiments, the image features may be extracted by one or more feature extraction layers and feed into other layers (e.g., hidden layers) of the machine learning model. The machine learning model may generate an estimated output based on the image features.

In 607, the processing device 120 (e.g., the training module 406) may obtain an assessment result by assessing a difference between the estimated output and a reference output corresponding to the inputted training sample. In some embodiments, the reference output may be the reference result corresponding to the image data of the at least one training sample. In some embodiments, the estimated output and the reference output may be inputted to an assessment layer (e.g., a loss function layer) for assessing the difference between the estimated output and the reference output of the machine learning model. In some embodiments, the assessment result for assessing the difference between the estimated output and the reference output may be determined based on a cost function. In some embodiments, the difference between the estimated output and the reference output may include an average difference (or average error). The assessment of the difference between the estimated output and the reference output may include determining a value of the cost function relating to the average difference. For example, an average output may be determined by averaging the plurality of reference outputs corresponding to the machine learning model. The average difference may be determined by comparing the estimated output and the average output based on the cost function. As another example, multiple errors between the estimated outputs and the reference outputs generated by the machine learning model may be determined based on the cost function. The average difference may be determined by averaging the multiple errors based on the cost function.

In some embodiments, the difference between the estimated output and the reference output may include a total difference (i.e., total error). The assessment of the difference between the estimated output and the reference output may include determining a value of the cost function relating to the total difference. The total difference may include multiple errors each of which between the estimated output and the reference output of the machine learning model.

In 609, the processing device 120 (e.g., the training module 406) may determine whether a termination condition is satisfied. If the termination condition is satisfied, process 609 may proceed to perform operation 613. If the termination condition is not satisfied, process 609 may proceed to perform operation 611. The termination condition may provide an indication of whether the machine learning model is sufficiently trained.

In some embodiments, the termination condition may relate to the value of a cost function. For example, the termination condition may be satisfied if the value of the cost function (e.g., the value of the cost function) is minimal or smaller than a threshold (e.g., a constant). As another example, the termination condition may be satisfied if the value of the cost function converges. In some embodiments, convergence may be deemed to have occurred if the variation of the values of the cost function (e.g., the value of the cost function) in two or more consecutive iterations is equal to or smaller than a threshold (e.g., a constant). In some embodiments, convergence may be deemed to have occurred if a difference between the value of the cost function (e.g., the value of the cost function) and a target value is equal to or smaller than a threshold (e.g., a constant). In some embodiments, the termination condition may be satisfied when a specified iteration number (or count) (i.e., iteration count) is performed in the training process.

In 611, the processing device 120 (e.g., the training module 406) may update, based on the assessment result, at least some of the parameter values of the machine learning model.

In some embodiments, at least one of the plurality of learning parameters may be adjusted. For example, the parameter value of at least some nodes may be adjusted until the value of the cost function satisfies a condition (e.g., exceeding a threshold). In some embodiments, the plurality of learning parameters of the machine learning model may be adjusted based on a back-propagation (BP) algorithm. Exemplary BP algorithms may include a stochastic gradient descent algorithm, an Adam algorithm, an Adagrad algorithm, an Adadelta algorithm, an RMSprop algorithm, or the like, or a combination thereof. In some embodiments, the processing device 120 may update the values of the parameters by performing an iteration of a backpropagation neural network training procedure, e.g., a stochastic gradient descent backpropagation training technique, to determine the updated values of the parameters of the neural network. That is, the processing device 120 may backpropagate the value of the cost function determined for the output of the output layer of the machine learning model through to each layer below the output layer in the machine learning model in order to adjust the parameters of each of the layers of the machine learning model.

In 613, the processing device 120 (e.g., the training module 406) may designate the machine learning model with the parameter values updated in a last iteration as the trained machine learning model.

In some embodiments, process 600 may be an iterative process that may be repeated with respect to a plurality of training samples to improve or optimize the machine learning model until a termination condition is satisfied. In different rounds of process 600, different training samples may be inputted into the machine learning model. In some embodiments, the termination condition may be that a specific number of training samples have been analyzed. In some embodiments, the termination condition may be that a specific number of iterations have been performed.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more operations may be omitted and/or one or more additional operations may be added. For example, operations 605 and 607 may be integrated into one operation. As another example, operation 603 may be omitted. In some embodiments, for each iteration, the processing device 120 may store the updated parameter values of the machine learning model in the storage device 408.

Figure 7:
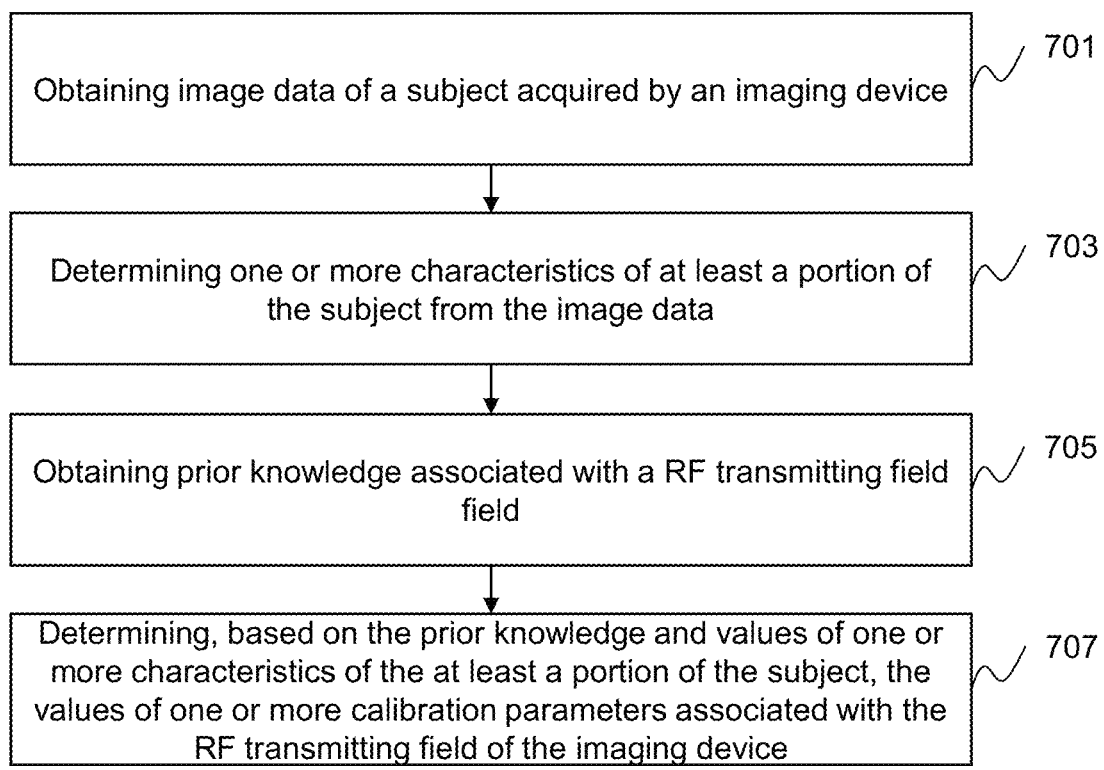
FIG. 7 is a flowchart illustrating an exemplary process for determining one or more calibration parameters associated with an RF transmitting field of an imaging device according to some embodiments of the present disclosure.

FIG. 7 is a flowchart illustrating an exemplary process for determining one or more calibration parameters associated with an RF transmitting field of an imaging device according to some embodiments of the present disclosure. In some embodiments, process 700 may be implemented as a set of instructions (e.g., an application) stored in the storage device 130, storage 220, or storage 390. The processing device 120, the processor 210 and/or the CPU 340 may execute the set of instructions, and when executing the instructions, the processing device 120, the processor 210 and/or the CPU 340 may be configured to perform the process 700. The operations of the illustrated process presented below are intended to be illustrative. In some embodiments, the process 700 may be accomplished with one or more additional operations not described and/or without one or more of the operations discussed. Additionally, the order of the operations of process 700 illustrated in FIG. 7 and described below is not intended to be limiting.

In 701, the processing device 120 (e.g., the acquisition module 410) may obtain image data of a subject acquired by an imaging device. The image data of the subject may be obtained as described in connection with operation 501 in FIG. 5. For example, the image data may be acquired by an imaging device (e.g., an MR scanner) via scanning the subject according to a fast pre-scanning sequence. More descriptions regarding the image data of the subject may be found elsewhere in the present disclosure. See, e.g., FIG. 5.

In 703, the processing device 120 (e.g., the characteristic information determination module 420) may determine one or more characteristics of the at least a portion of the subject (e.g., a body part) from the image data. The at least a portion of the subject (e.g., a body part) may be determined as described in connection with operation 503 illustrated in FIG. 5. For example, the processing device 120 may determine one or more characteristics of the at least a portion of the subject (e.g., a body part) using a trained machine learning model. As another example, the one or more characteristics of the at least a portion of the subject may include the contour or boundary of the at least a portion of the subject, the part or position (e.g., the head, the abdomen, the heart, a breast, etc.) of the at least a portion of the subject in the subject, types of one or more tissues of the at least a portion of the subject (e.g., bone, blood, etc.), the geometric morphology (e.g., obese or thin, the geometric shape of the at least a portion of the subject, the size of the at least a portion of the subject, etc.) of the at least a portion of the subject, water and/or fat content information (e.g., fat content information and/or water content information) of the at least a portion of the subject, etc. The water and/or fat content information of at least a portion of the subject may include a proportion of water in the at least a portion of the subject, a proportion of fat in the at least a portion of the subject, or combination thereof. More descriptions regarding the characteristics of the at least a portion of the subject (e.g., a body part) may be found elsewhere in the present disclosure (e.g., see, e.g., FIG. 5 and the descriptions thereof).

In 705, the processing device 120 (e.g., the acquisition module 410) may obtain prior knowledge associated with an RF transmitting field corresponding to different reference body parts. In some embodiments, a reference body part may be similar to the body part as described elsewhere in the present disclosure (e.g., FIGS. 1 and 5, and the descriptions thereof). For example, a reference body part may include a body or a portion of the body of a human, such as an organ, a tissue of a patient, etc. In some embodiments, the prior knowledge associated with the RF transmitting field corresponding to different reference body parts may provide a first relationship between RF transmitting modes and information associated with the reference body parts. The information associated with a reference body part may be indicative of one or more characteristics of the reference body part. The one or more characteristics of the reference body part may include the size of the reference body part, the shape of the reference body part, the contour or boundary of the reference body part, the position or part (e.g., the head, the abdomen, the heart, a breast, etc.) of the reference body part in a subject, types of one or more tissues of the reference body part, the geometric morphology (e.g., obese or thin, the geometric shape of the reference body part, the size of the reference body part, etc.) of the reference body part, water and/or fat content information of the reference body part (e.g., a proportion of water in the reference body part and/or a proportion of fat in the reference body part), etc. An RF transmitting mode may be defined by one or more parameters associated with the RF transmitting field. Exemplary parameters associated with the RF transmitting field may include an amplitude of the RF transmitting field, a phase of the RF transmitting field, or the like, or a combination thereof. Different information of reference body parts (i.e., different combinations of characteristics of reference body parts) may correspond to different RF transmitting modes, i.e., different combinations of values of the phase, the amplitude, etc., of the RF transmitting field.

In some embodiments, the prior knowledge associated with the RF transmitting field corresponding to different reference body parts may provide a second relationship between RF pulse sequences and information associated with the reference body parts. An RF pulse sequence may be defined by one or more parameters associated with the RF pulse sequence. The one or more parameters associated with the RF pulse sequence may include an initial value of RF transmitting gain, an FOV of the RF pulse sequence, or the like, or a combination thereof. Different information of reference body parts (i.e., different combinations of characteristics of reference body parts) may correspond to different RF pulse sequences, i.e., different combinations of values of the initial gain value, the FOV, etc., of the RF pulse sequence. The prior knowledge may be used to determine an RF transmitting mode and/or an RF pulse sequence corresponding to a reference body part based on the first relationship and/or the second relationship, respectively, according to the information of the reference body part.

In some embodiments, the prior knowledge associated with the RF transmitting field may be stored in the storage device 130, the storage 220, the storage 390, or any other storage device. The processing device 120 may retrieve the prior knowledge associated with the RF transmitting field from the storage device 130, the storage 220, the storage 390, or any other storage device. For example, the prior knowledge associated with the RF transmitting field may be stored in the form of a table. The table may record multiple groups of information of reference body parts. Each group of the multiple groups of information of reference body parts may include information regarding a part of a reference body part in a subject (e.g., the head, the abdomen, the breasts, etc.), the geometric morphology of the reference body part (e.g., obese or thin, the size of the reference body part), the water and fat contents of the reference body part, etc. The table may also record an RF transmitting mode and/or an RF pulse sequence corresponding to each group of the multiple groups of information of the reference body parts. As another example, the prior knowledge may be stored in the form of one or more functions. The one or more functions may be indicative of the first relationship and/or the second relationship. As a further example, a function may provide the first relationship between the amplitude and/or the phase of the RF transmitting field and water and fat contents of a reference body part when the reference body part is the head of a subject (e.g., a patient). As still a further example, a function may provide the second relationship between the initial gain value of the RF pulse sequence and a fat content when the reference body part is the breasts of a subject (e.g., a patient).

In 707, the processing device 120 (e.g., the parameter determination module 430) may determine the values of one or more calibration parameters associated with the RF transmitting field of the imaging device based on the prior knowledge associated with the RF transmitting field and the one or more characteristics of the body part. The calibration parameters associated with the radio frequency field may include one or more parameters associated with an RF transmitting mode, such as an amplitude of the RF transmitting field, a phase of the RF transmitting field, etc., and/or one or more parameters associated with an RF pulse sequence, such as an initial value of RF transmitting gain, an FOV of the RF pulse sequence, etc. The one or more characteristics of the body part may include the contour or boundary of the body part, the position or part (e.g., the head, the abdomen, the heart, a breast, etc.) of the body part in the subject, types of one or more tissues of the body part, the geometric morphology (e.g., obese or thin, the size of the body part, the geometric shape of the body part, etc.) of the body part, water and/or fat content information (e.g., fat content information and/or water content information) of the body part, etc., as described elsewhere in the present disclosure (e.g., FIG. 5 and the descriptions thereof).

In some embodiments, the processing device 120 may determine the one or more calibration parameters associated with the radiofrequency field of the imaging device by comparing the one or more characteristics of the body part with the prior knowledge associated with the RF transmitting field. The processing device 120 may determine the one or more calibration parameters associated with the RF transmitting field based on the comparison. For example, the processing device 120 may determine one specific group of information from the multiple groups of information of reference body parts recorded in the prior knowledge associated with the RF transmitting field. The one specific group of information may be similar to or the same as the one or more characteristics of the body part. As used herein, "similar to or the same as" indicates that the deviation of two characteristics of a same type (e.g., water content, fat content) of a reference body part and the body part does not exceed a threshold, e.g., 30%, 20%, or 15%, or 10%, or 5% of one of the two characteristics of the same type (e.g., water and fat contents) of the reference body part and the body part. The processing device 120 may determine parameter values associated with an RF transmitting mode and/or an RF pulse sequence corresponding to the one specific group of information as the calibration parameters associated with the radiofrequency field corresponding to the body part.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more operations may be omitted and/or one or more additional operations may be added. For example, the processing device 120 may store information and/or data associated with the calibration parameters associated with the RF transmitting field in a storage device (e.g., the storage device 130).

Figure 8:
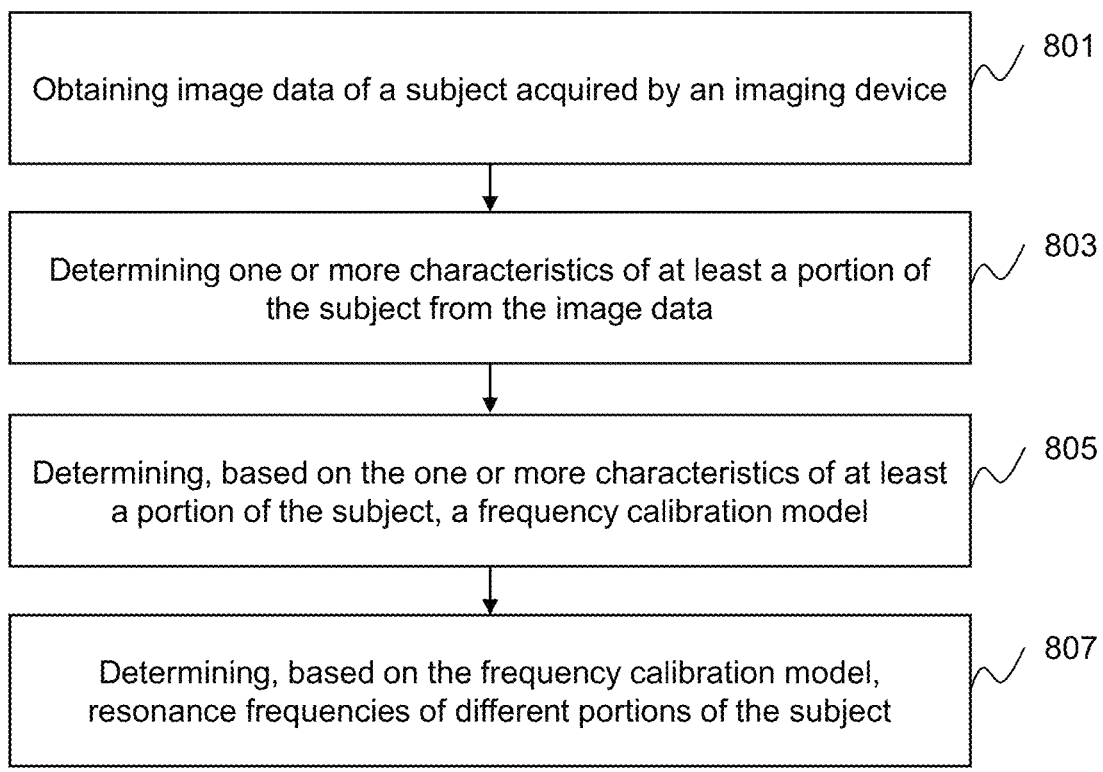
FIG. 8 is a flowchart illustrating an exemplary process for frequency calibration according to some embodiments of the present disclosure.

FIG. 8 is a flowchart illustrating an exemplary process for frequency calibration according to some embodiments of the present disclosure. In some embodiments, process 800 may be implemented as a set of instructions (e.g., an application) stored in the storage device 130, storage 220, or storage 390. The processing device 120, the processor 210 and/or the CPU 340 may execute the set of instructions, and when executing the instructions, the processing device 120, the processor 210 and/or the CPU 340 may be configured to perform the process 800. The operations of the illustrated process presented below are intended to be illustrative. In some embodiments, the process 800 may be accomplished with one or more additional operations not described and/or without one or more of the operations discussed. Additionally, the order of the operations of process 800 illustrated in FIG. 8 and described below is not intended to be limiting.

In 801, the processing device 120 (e.g., the acquisition module 410) may obtain image data of a subject acquired by an imaging device. The image data of the subject may be obtained as described in connection with operation 501 in FIG. 5. For example, the image data may be acquired by an imaging device (e.g., an MR scanner) via scanning the subject according to a fast pre-scanning sequence. More descriptions regarding the image data of the subject may be found elsewhere in the present disclosure. See, e.g., FIG. 5.

In 803, the processing device 120 (e.g., the characteristic information determination module 420) may determine one or more characteristics of the at least a portion of the subject (e.g., a body part) from the image data. The at least a portion of the subject (e.g., a body part) may be determined as described in connection with operation 503 illustrated in FIG. 5. For example, the processing device 120 may determine one or more characteristics of the at least a portion of the subject (e.g., a body part) using a trained machine learning model. As another example, the one or more characteristics of the at least a portion of the subject may include the contour or boundary of the at least a portion of the subject, the part or position (e.g., the head, the abdomen, the heart, a breast, etc.) of the at least a portion of the subject in the subject, types of one or more tissues of the at least a portion of the subject (e.g., bone, blood, etc.), the geometric morphology (e.g., obese or thin, the geometric shape of the at least a portion of the subject, the size of the at least a portion of the subject) of the at least a portion of the subject, water and/or fat content information (e.g., fat content information and/or water content information) of the at least a portion of the subject, etc. The water and/or fat content information of at least a portion of the subject may include a proportion of water in the at least a portion of the subject, a proportion of fat in the at least a portion of the subject, or combination thereof. More descriptions regarding the characteristics of the at least a portion of the subject (e.g., a body part) may be found elsewhere in the present disclosure (e.g., see, e.g., FIG. 5 and the descriptions thereof).

In 805, the processing device 120 (e.g., the parameter determination module 430) may determine, based on information of the at least a portion of the subject (e.g., a body part) a frequency calibration model corresponding to the at least a portion of the subject (e.g., a body part). The information of the at least a portion of the subject (e.g., a body part) may be indicative of one or more characteristics of the at least a portion of the subject (e.g., a body part). The one or more characteristics of the at least a portion of the subject (e.g., a body part) may include the contour or boundary of the at least a portion of the subject (e.g., a body part), the position or part of the at least a portion of the subject (e.g., a body part) (e.g., the head, the abdomen, the heart, a breast, etc.) in the subject, types of one or more tissues of the at least a portion of the subject (e.g., a body part), the geometric morphology (e.g., obese or thin, the size of the at least a portion of the subject, the geometric shape of the at least a portion of the subject (e.g., a body part)) of the at least a portion of the subject (e.g., a body part), water and/or fat content information (e.g., fat content information and/or water content information) of the at least a portion of the subject (e.g., a body part), etc.

For an MR scanner, the B0 magnetic field corresponding to a subject's neck, the cervical vertebra, the thoracic vertebrae, and other parts may be uneven, which may lead to the broadening or splitting of the frequency components of a frequency spectrum (or spectrum curve), thereby causing the inaccuracy of frequency calibration. The high fat proportion of, such as a breast, the pelvis, a knee joint, etc., may also lead to the broadening of the frequency spectrum, thereby causing the inaccuracy of frequency calibration. Generally speaking, on a spectrum curve, a fat peak is located in the range of a fat peak group, and a water peak is usually located in the range of a water peak group. Generally, the height of the fat peak group is smaller than the height of the water peak group, and the difference between the height of the fat peak group and the height of the water peak group is 3.5 ppm. For an obese patient, the fat content may be relatively high, and the peak value of the fat peak may be higher than the peak value of the water peak. If the location of the fat peak or the water peak is determined solely based on where a higher peak value is located, without taking into consideration of specific information of different patients (e.g., obesity), a wrong result may be obtained for subjects with different contents of body fat.

In some embodiments, the frequency calibration model corresponding to the at least a portion of the subject (e.g., a body part) may include a model of an intensity ratio of peaks (also referred to as an intensity ratio model). The intensity ratio model may be configured to provide an intensity ratio between peaks (e.g., the water peak and the fat peak) in the at least a portion of the subject (e.g., a body part). In some embodiments, the processing device 120 may determine the intensity ratio model corresponding to the at least a portion of the subject (e.g., a body part) based on the water and/or fat content information (e.g., fat content information and/or water content information) and the position or type of the at least a portion of the subject (e.g., a body part). For example, the processing device 120 may determine the intensity ratio model corresponding to the at least a portion of the subject (e.g., a body part) from multiple intensity ratio models according to the water and/or fat content information (e.g., fat content information and/or water content information) and the position of the at least a portion of the subject (e.g., a body part). Each of the multiple intensity ratio models may correspond to a range or a value of the water content of a reference at least a portion of the subject (e.g., a body part), a range or a value of the fat content of the reference at least a portion of the subject (e.g., a body part), and a type of the reference at least a portion of the subject (e.g., a body part) (e.g., the breasts, the pelvic cavity, etc.). The processing device 120 may determine the intensity ratio model corresponding to the at least a portion of the subject (e.g., a body part) from the multiple intensity ratio models based on the type of the at least a portion of the subject (e.g., a body part), the water content in the at least a portion of the subject (e.g., a body part), and the fat content in the at least a portion of the subject (e.g., a body part).

In some embodiments, the frequency calibration model corresponding to the at least a portion of the subject (e.g., a body part) may include a number or count of peaks model (also referred to as a peak number (or count) model or spectrum component number (or count) model). The peak number model may be configured to estimate and/or describe the number or count of peaks (e.g., water peaks, fat peaks, etc.) or components in the frequency spectrum of the at least a portion of the subject (e.g., a body part). In some embodiments, the processing device 120 may determine the peak number model based on the water and/or fat content information and the position or type of the at least a portion of the subject (e.g., a body part). For example, the processing device 120 may determine the peak number model from multiple peak number models according to the position or type of the at least a portion of the subject (e.g., a body part) in the subject. Each of the multiple peak number models may correspond to a position of a reference portion (e.g., a body part) in a subject (e.g., the breasts, the pelvic cavity, the thoracic part, etc.). The processing device 120 may determine the peak number model corresponding to the at least a portion of the subject (e.g., a body part) from the multiple peak number models based on the position or type of at least a portion of the subject (e.g., a body part) in the subject.

In 809, the processing device 120 may determine, based on the frequency calibration model, resonance frequencies of different portions of the at least a portion of the subject (e.g., a body part). In some embodiments, the processing device 120 may calibrate a spectrum curve (also referred to as frequency spectrum) of the at least a portion of the subject (e.g., a body part) based on the frequency calibration model. The calibrated spectrum curve may conform to the frequency calibration model. For example, the intensity ratio of peaks (e.g., a water peak and a fat peak) may conform to the intensity ratio of peaks provided by the intensity ratio model corresponding to the at least a portion of the subject (e.g., a body part). As another example, the number (or count) of water peaks and/or the number (or count) of fat peaks may conform to the number (or count) of peaks provided by the peak number model corresponding to the at least a portion of the subject (e.g., a body part). The processing device 120 may determine the resonance frequencies of different portions (e.g., the water, the fat tissue) of the at least a portion of the subject (e.g., a body part) from the calibrated spectrum curve.

Figure 9:
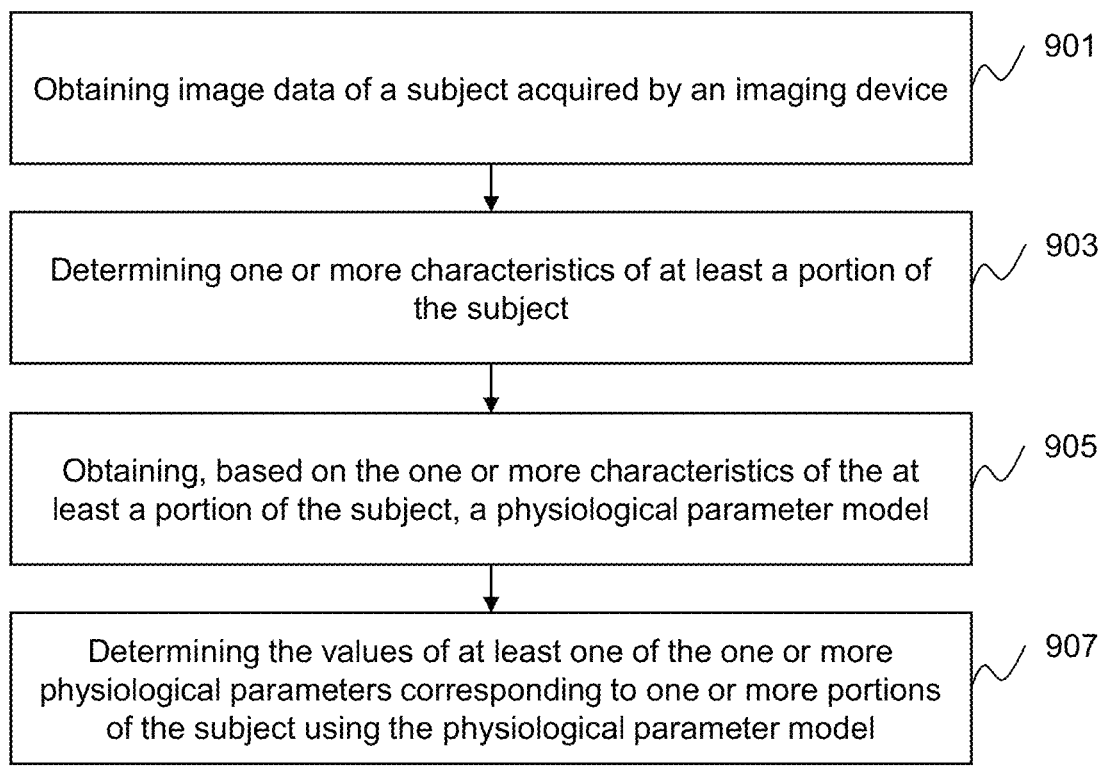
FIG. 9 is a flowchart illustrating an exemplary process for monitoring one or more physiological parameters according to some embodiments of the present disclosure.

FIG. 9 is a flowchart illustrating an exemplary process for monitoring physiological parameters of the subject in the imaging scan according to some embodiments of the present disclosure. In some embodiments, process 900 may be implemented as a set of instructions (e.g., an application) stored in the storage device 130, storage 220, or storage 390. The processing device 120, the processor 210 and/or the CPU 340 may execute the set of instructions, and when executing the instructions, the processing device 120, the processor 210 and/or the CPU 340 may be configured to perform the process 900. The operations of the illustrated process presented below are intended to be illustrative. In some embodiments, the process 900 may be accomplished with one or more additional operations not described and/or without one or more of the operations discussed. Additionally, the order of the operations of the process 900 illustrated in FIG. 9 and described below is not intended to be limiting.

In 901, the processing device 120 (e.g., the acquisition module 410) may obtain image data of a subject acquired by an imaging device. The image data of the subject may be obtained as described in connection with operation 501 in FIG. 5. For example, the image data may be acquired by an imaging device (e.g., an MR scanner) via scanning the subject according to a fast pre-scanning sequence. As another example, the image data may be acquired by an imaging device (e.g., an MR scanner) via scanning the subject according to an imaging sequence (e.g., a spin echo (SE) sequence, a fast SE sequence, an echo planar imaging (EPI) sequence, etc.). More descriptions regarding the image data of the subject may be found elsewhere in the present disclosure. See, e.g., FIG. 5.

In 903, the processing device 120 (e.g., the characteristic information determination module 420) may determine one or more characteristics of the at least a portion of the subject (e.g., a body part) from the image data. The at least a portion of the subject (e.g., a body part) may be determined as described in connection with operation 503 illustrated in FIG. 5. For example, the processing device 120 may determine one or more characteristics of the at least a portion of the subject (e.g., a body part) using a trained machine learning model. As another example, the one or more characteristics of the at least a portion of the subject may include the contour or boundary of the at least a portion of the subject, the part or position (e.g., the head, the abdomen, the heart, a breast, etc.) of the at least a portion of the subject in the subject, types of one or more tissues of the at least a portion of the subject (e.g., bone, blood, etc.), the geometric morphology (e.g., obese or thin, the geometric shape of the at least a portion of the subject, the size of the at least a portion of the subject) of the at least a portion of the subject, water and/or fat content information (e.g., fat content information and/or water content information) of the at least a portion of the subject, etc. The water and/or fat content information of at least a portion of the subject may include a proportion of water in the at least a portion of the subject, a proportion of fat in the at least a portion of the subject, or combination thereof. More descriptions regarding the characteristics of the at least a portion of the subject (e.g., a body part) may be found elsewhere in the present disclosure (e.g., see, e.g., FIG. 5 and the descriptions thereof).

In 905, the processing device 120 (e.g., the parameter determination module 430) may obtain, based on the one or more characteristics of the at least a portion of the subject, a physiological parameter model. The physiological parameter model may provide a relationship of values of a physiological parameter in different parts of the subject or at least a portion of the subject. The physiological parameter may include a specific absorption ratio (SAR), a peripheral nerve stimulation (PNS), etc. For example, the physiological parameter model may include a SAR distribution model configured to be indicative of a distribution of SARs with respect to different parts of the subject or the at least a portion of the subject. As another example, the physiological parameter model may include a PNS distribution model configured to be indicative of a distribution of PNSs with respect to different parts of the subject or the at least a portion of the subject.

The physiological parameter model may be used to determine or estimate the value of a physiological parameter corresponding to one or more portions of the subject or the body part of the subject. Different subjects or different portions of a subject (e.g., body part) may correspond to different physiological parameter models. Exemplary characteristics of a body part of a subject may include the geometric morphology of the body part, the contour or boundary of the body part, the part or position (e.g., the head, the abdomen, the heart, a breast, etc.) of the body part in the subject, types of one or more tissues of the body part (e.g., bone, blood, etc.), water and/or fat content information of the subject (e.g., a water proportion or content in the subject or the body part, a fat proportion or content in the subject or the body part), etc. The processing device 120 may determine a physiological parameter model from the different physiological parameter models according to the characteristics of the body part. For example, each of the different physiological parameter models may correspond to a reference body part with reference characteristics. The processing device 120 may determine a reference body part from multiple body parts that includes one or more characteristics are similar to or same as the one or more characteristics of the body part. The processing device 120 may designate the physiological parameter model corresponding to the reference body part as the physiological parameter model corresponding to the body part.

In 907, the processing device 120 (e.g., the parameter determination module 430) may determine the values of a physiological parameter corresponding to one or more portions of the subject using the physiological parameter model. For example, the processing device 120 may determine the values of the SAR of different portions of the subject using the SAR distribution model.

In some embodiments, process 900 may further include determining one or more individualized parameters based on the information of the body part. In some embodiments, process 900 may further include causing an imaging device to scan the subject. The imaging device may be the same as or different from the imaging device that acquires the image data in operation 901.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more operations may be omitted and/or one or more additional operations may be added. For example, an additional operation in which the processing device 120 may determine one or more individualized parameters corresponding to the subject based on one or more characteristics of the body part may be added.

EXAMPLES

The following examples are provided for illustration purposes and are not intended to limit the scope of the present disclosure.

Figure 10:
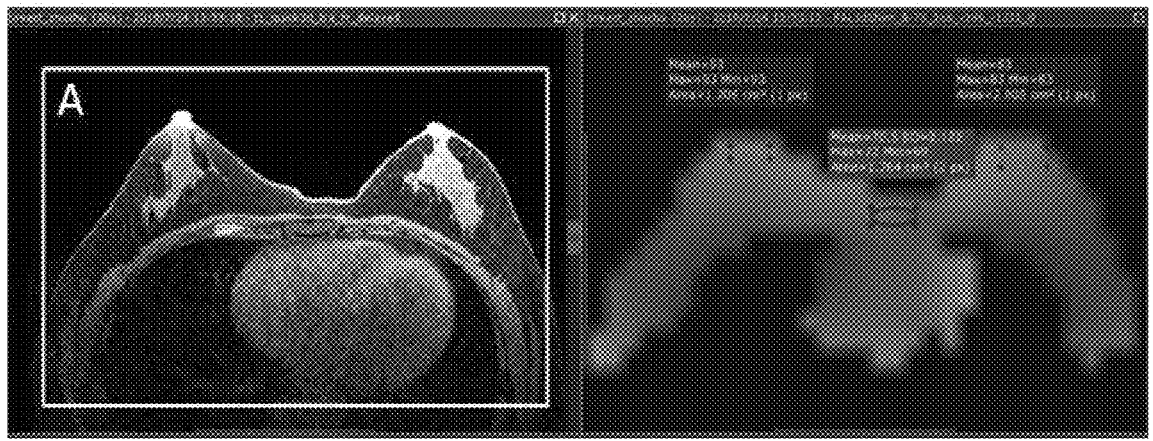
FIG. 10 shows exemplary images of the breasts of a subject and corresponding B0 magnetic fields according to some embodiments of the present disclosure.
Figure 10:
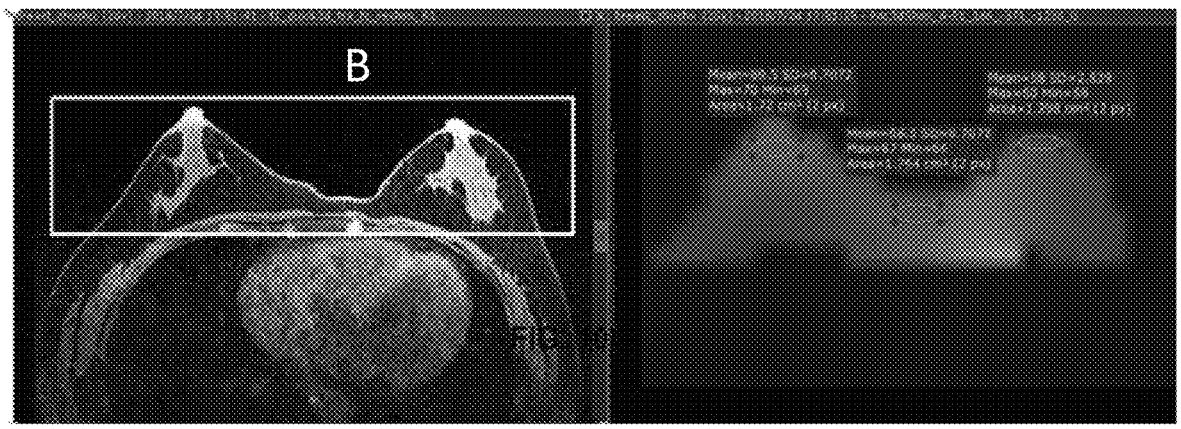

Example 1 Exemplary Images of the Breasts of a Subject and Corresponding B0 Magnetic Fields FIG. 10 shows images of the breasts of a subject and corresponding B0 magnetic fields according to some embodiments of the present disclosure. As shown in FIG. 10, image 1 of the breasts of the subject was acquired under a shimming sequence FOV denoted by rectangle box A. Image 2 shows a distribution of the B0 magnetic field with respect to the subject when the shimming sequence FOV was set in an area corresponding to rectangle box A in image 1. Image 3 of the breasts of the same subject was acquired under a shimming sequence FOV denoted by rectangle box B. Image 4 shows a distribution of the B0 magnetic field with respect to the subject when the shimming sequence FOV was set as in an area corresponding to rectangle box B in image 3. The size of the shimming sequence FOV corresponding to image 1 exceeds the size of the shimming sequence FOV corresponding to image 3. The size of the shimming sequence FOV corresponding to image 1 was 500*450*450 mm. The size of the shimming sequence FOV corresponding to image 3 was 250*450*450 mm.

According to some embodiments of the present disclosure, the shimming sequence FOV corresponding to image 3 was determined according to information (e.g., the position, the geometrical morphology) of a body part (i.e., the breasts) of the subject as described elsewhere in the present disclosure (e.g., FIG. 5 and the descriptions thereof). The shimming sequence FOV corresponding to image 3 determined according to the information of the breasts enclosed the breasts but not other portions of the subject around the breasts. Compared to image 1, image 3 has decreased image fold, and a decreased scanning time under the same spatial resolution as image 1, or increased spatial resolution under the same scanning time with respect to the shimming sequence FOV corresponding to image 1. Accordingly, the shimming sequence FOV determined according to the body part may decrease scanning time and/or increase spatial resolution.

As image 2 and image 4 show, the uniformity of B0 magnetic field corresponding to the smaller shimming sequence FOV denoted by rectangle box B is greater than the uniformity of the B0 magnetic field corresponding to the larger shimming sequence FOV denoted by rectangle box A. As shown in image 2, the average intensity of the B0 magnetic field in three regions denoted by elliptical boxes is 93 Hz, 70.5 Hz, and 83 Hz, respectively. As shown in image 4, the average intensity of the B0 magnetic field in the three regions denoted by elliptical boxes is 69.5 Hz, 66.5 Hz, and 58 Hz, respectively.

Accordingly, a shimming sequence FOV that substantially conforms to a body part of the subject may decrease the scanning time and/or improve the accuracy of the shimming result of the B0 magnetic field with improved uniformity of the B0 magnetic field, which may also improve the speed of shimming calibration of the B0 magnetic field and accuracy.

Figure 11:
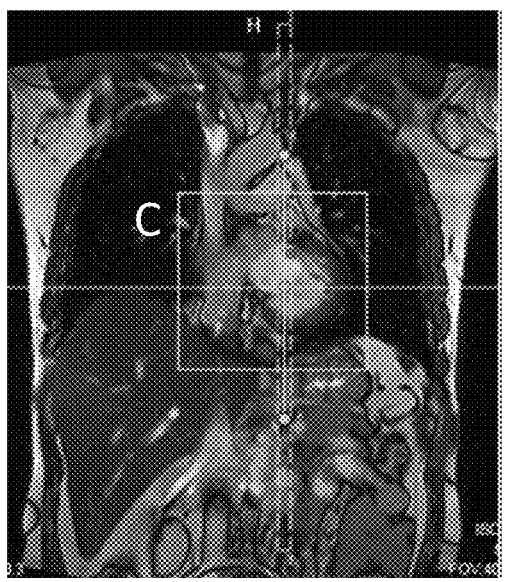
FIG. 11 shows exemplary images of the heart of a subject according to some embodiments of the present disclosure.
Figure 11:
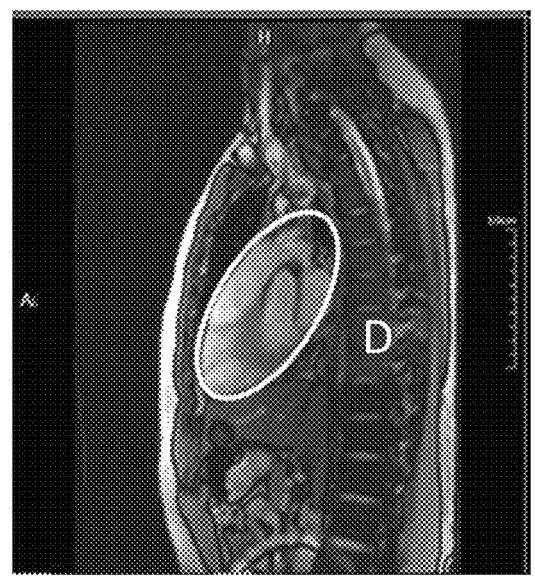

Example 2 Exemplary Pre-Scanning Images of the Heart of a Subject with Shimming Areas of a B0 Magnetic Field FIG. 11 shows images of the heart of a subject according to some embodiments of the present disclosure. As shown in FIG. 11, image 5 and image 6 of the heart were acquired by an MR scanner according to a fast pre-scanning sequence as described elsewhere in the present disclosure (e.g., FIG. 5 and the descriptions thereof). In some embodiments, an operator may desire to shim or optimize the B0 magnetic field corresponding to the heart, but not to shim or optimize the B0 magnetic field corresponding to the liver and the chest.

At present, the optimization or shimming portion of a shimming algorithm for the B0 magnetic field may be adjusted manually via a user interactive interface to enclose the heart. An optimization or shimming box on the user interactive interface may be used to represent the optimization or shimming portion where the shimming algorithm needs to be applied. The operations for determining the optimization box of the shimming algorithm may be complex and provide poor user experience, and demand high operator experience and/or skills. The optimization box is usually a fixed shape (e.g., rectangular as illustrated in image 5), while an optimization box of another shape, e.g., an optimization box of an arbitrary shape of an operator's choice is not permitted. As shown in image 5, the B0 magnetic field corresponding to the heart was not accurately shimmed based on the shimming portion (i.e., shimming sequence FOV) determined by rectangle box C (i.e., optimization box), because the rectangular box C enclosed or covered part of the liver, the spleen, and chest wall muscles, which may decrease the quality of an image of the heart.

As shown in image 6, a body part (i.e., the heart) was determined from image 6 as described elsewhere in the present disclosure (e.g., FIG. 5 and the descriptions thereof). For example, image 6 was inputted into a trained machine learning model. The heart was determined by the trained machine learning model from image 6. And the identified heart was marked by the trained machine learning model using an oval box D, which was used to represent the optimization or shimming portion of a shimming algorithm for the B0 magnetic field corresponding to the heart. In some embodiments, the oval box D may represent a mask. When the mask was applied on image 6, the B0 magnetic field corresponding to the heart region in image 6 was optimized or shimmed and the B0 magnetic field corresponding to the liver and chest was omitted in the optimization or shimming, which may improve the accuracy of the shimming result of the B0 magnetic field. And a manual determination of an optimization box for shimming of the B0 magnetic field by an operator may be obviated. In some embodiments, an automatically determined optimization box may be adjusted based on an instruction by an operator, which may also improve user experience of the operator, reduce inter-personal variations, and improve efficiency and/or consistency of the imaging procedure.

Example 3 Exemplary Pre-Scanning Images of a Portion of the Body of a Subject

Figure 12:
FIG. 12 shows images of a portion of the body of a subject according to some embodiments of the present disclosure.

FIG. 12 shows images of a portion of the body of a subject according to some embodiments of the present disclosure. As shown in FIG. 12, image 7 and image 8 of a portion of a body of a subject were acquired by an MR scanner according to a fast pre-scanning sequence as described elsewhere in the present disclosure (e.g., FIG. 5 and the descriptions thereof). A body part (i.e., a hand) of the subject was determined from image 7 and image 8 and marked by rectangle boxes E and F as shown in FIG. 12. Parameters associated with an RF transmitting mode and an RF pulse sequence (e.g., an FOV or initial value of RF transmitting gain associated with the RF pulse sequence) may be determined according to the information of the body part, such as position information of the body part in the subject, geometrical morphology information, water and/or fat content information (e.g., fat content information and/or water content information), etc.

The uniformity of an RF transmitting field may be influenced by the characteristics of a subject when an MR scan is performed. For example, the geometric size of different parts (e.g., the head and the abdomen) of the same subject (e.g., a patient) is different which may cause the uniformity of an RF transmitting field in different parts of the same subject to be different. The position of different parts on a scanning bed is different which may cause the uniformity of an RF transmitting field in different parts of the same subject to be different. For example, the trunk may be located at the center of the scanning bed and the shoulders and the arms may be located at the edge of the scanning bed. The water and fat contents of the same part of different patients are different, and the geometric morphology of the same part of different patients is different (e.g., obese and thin) which may cause the uniformity of an RF transmitting field in different parts of the same subject to be different. An RF transmitting mode (i.e. the phase and the amplitude of the RF transmitting field) for different positions, geometric morphologies, water and/or fat contents may be determined according to position information, geometric morphology information, water and/or fat content information, etc., to obtain an RF transmitting field with improved uniformity.

For an obese patient, the requirements for RF transmitting gain may be high, while for thin patients, the requirements for RF transmitting gain may be low. The RF transmitting field (i.e., B1 magnetic field) corresponding to the torso part of a body (e.g., the abdomen, the pelvis, the breasts) is obviously uneven, which may need a high RF transmitting gain. However, for the head or a knee joint, due to the small tissue shape, the RF transmitting gain may be often low. Therefore, according to the position information, the geometric morphology information, the water and/or fat content information, one or more initial values of RF transmitting gain associated with the RF pulse sequence may be optimized. The initial values of RF transmitting gain for an obese patient may be larger than that of thin patients, which may reduce the number of iterations of RF pulse sequence calibration, thereby improving the speed of RF pulse sequence calibration.

As shown in image 7 and image 8, a body part (i.e., a hand) was determined from image 7 and image 8 as described elsewhere in the present disclosure (e.g., FIG. 5 and the descriptions thereof). For example, image 7 was inputted into a trained machine learning model. A hand was identified by the trained machine learning model. And the identified hand was marked by the trained machine learning model using a box E, which was used to determine a scanning position or range and/or FOV of an RF pulse sequence. The traditional RF pulse sequence calibration is usually aimed at the tissue on the cross-section of the scanning bed, such as the area denoted by box E in image 7, so the RF transmitting gain result cannot represent the RF transmitting gain value needed by the wrist part. The FOV of the RF pulse sequence is shown by box F in image 8, which is only conducted for the wrist and the palm, which may improve the accuracy of the calibration result of RF transmitting gain.

Figure 13:
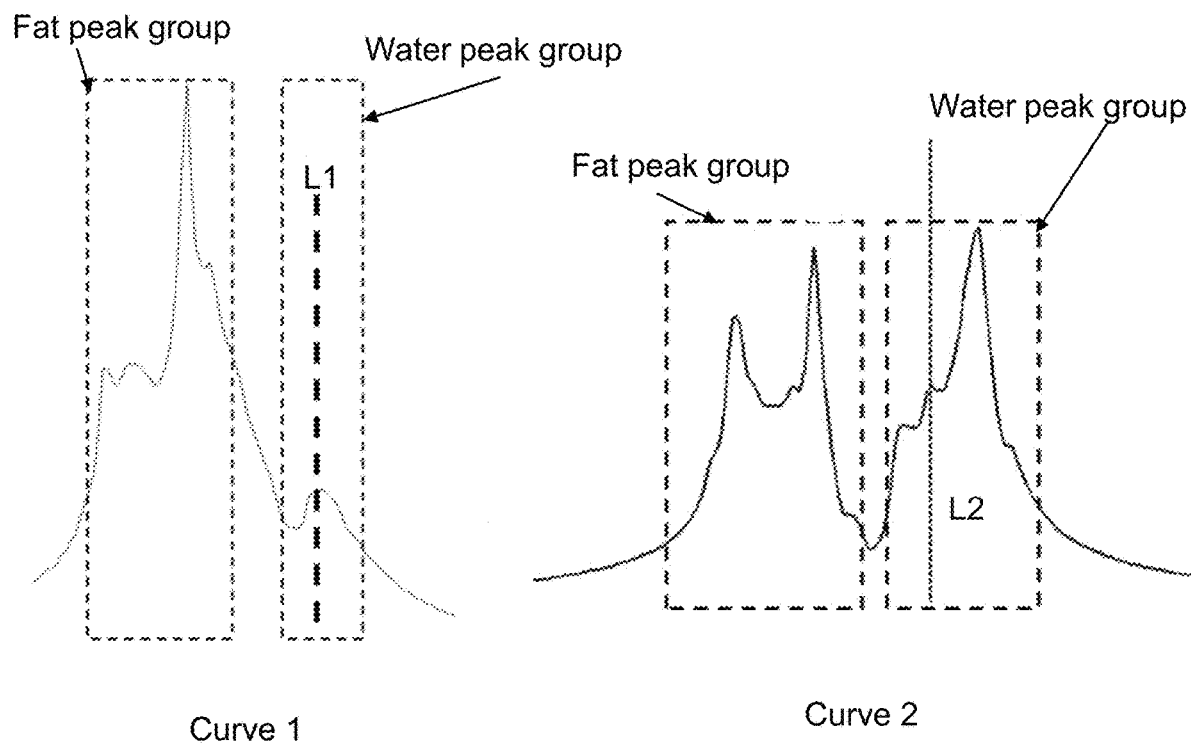
FIG. 13 shows spectrum curves of water and fat in the breasts according to some embodiments of the present disclosure.

Example 4 Exemplary Frequency Spectrums (or Spectrum Curves) of the Breasts of a Subject FIG. 13 shows exemplary spectrum curves of water and fat in the breasts of a subject according to some embodiments of the present disclosure. According to some embodiments of the present disclosure, an image of at least a portion of the subject was acquired by an MR scanner according to a fast pre-scanning sequence as described elsewhere in the present disclosure (e.g., FIG. 5 and the descriptions thereof). A body part was determined from the image. One or more frequency calibration parameters (e.g., the number of components of a frequency spectrum, the intensity ratios of the components) may be determined according to the information of the body part, such as position information, water and/or fat content information, etc.

According to some embodiments of the present disclosure, the number or count of peaks of a frequency spectrum and/or the intensity ratios of the components of the frequency spectrum may be determined according to the information of the body part, such as position information, water and/or fat content information, etc. As shown in FIG. 13, curve 1 shows a spectrum curve of the breasts of a subject. The height (i.e., the intensity) of the fat peak is much higher than the height of the water peak. According to some embodiments of the present disclosure, a model of an intensity ratio of peaks may be determined according to the water and fat contents to fit the spectrum curve to obtain a more accurate result of the location of the water peak denoted by a virtual line L1 in curve 1.

Curve 2 shows a spectrum curve of the thoracic vertebrae of the subject. Curve 2 shows that both the fat peak and the water peak are widened and split, and there is more than one peak in the fat peak group and also more than one peak in the water peak group because the thoracic vertebrae is close to the lung cavity, and the B0 magnetic field is uneven. According to some embodiments of the present disclosure, a number of peaks model with broadening split (i.e., the number or count of spectrum components is expanded from 2 peaks to more than 2 peaks) may be determined according to the water and fat contents to fit the spectrum curve to obtain a more accurate result of the location of the water peak denoted by virtual line L2 in curve 2.

In some embodiments, by identifying the position information and water fat content information, the number or count of spectrum components (denoted as peaks in the spectrum curve) and/or the intensity ratio of components may be optimized to improve the accuracy of the identified location of a water peak, which in turn may improve the accuracy and stability of frequency calibration.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer-readable program code embodied thereon.

A non-transitory computer-readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer-readable signal medium may be any computer-readable medium that is not a computer-readable storage medium and that may communicate, propagate, or transport a program for use by or in connection with an instruction execution system, apparatus, or device. Program code embodied on a computer-readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C #, VB. NET, Python or the like, conventional procedural programming languages, such as the "C" programming language, Visual Basic, Fortran, Perl, COBOL, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system, comprising:
   at least one storage device storing executable instructions, and
   at least one processor in communication with the at least one storage device, when executing the executable instructions, causing the system to perform operations including:
      obtaining image data of a subject, the image data including pre-scanning data, a scout image, or a diagnostic image;
      determining one or more characteristics associated with a body part of the subject from the image data using a trained machine learning model, the one or more characteristics of the body part of the subject including at least one of position information of the body part in the subject, geometric morphology information of the body part, water content information, or fat content information;
      determining, based on the one or more characteristics associated with the body part, values of one or more individualized parameters corresponding to the subject; and
      causing an imaging device to perform an imaging scan on the subject according to the values of the one or more individualized parameters.

2. The system of claim 1, wherein the imaging device includes a magnetic resonance (MR) scanner, and the image data is acquired by the imaging device via scanning the subject according to a fast pulse sequence.

3. The system of claim 1, wherein the image data of the subject includes a scout image associated with the body part of the subject.

4. The system of claim 1, wherein the image data of the subject includes at least one of an amplitude image, a phase image, or k-space data.

5. The system of claim 1, wherein the one or more individualized parameters include one or more calibration parameters associated with a main magnetic field of the imaging device.

6. The system of claim 5, wherein to determine, based on the one or more characteristics of the body part, one or more individualized parameters corresponding to the subject, the at least one processor is configured to cause the system to perform the operations including:
   determining, based on the position information and the geometric morphology information of the body part, the one or more calibration parameters associated with the main magnetic field including at least one of a calibration parameter of a shimming sequence or a calibration parameter of a shimming algorithm.

7. The system of claim 6, wherein the calibration parameter of the shimming sequence includes at least one of a field of view (FOV) or a spatial resolution corresponding to the main magnetic field of the imaging device, and the calibration parameter of the shimming algorithm includes a shimming portion of the subject that needs to be optimized using the shimming algorithm.

8. The system of claim 1, wherein the one or more individualized parameters include one or more calibration parameters associated with a radiofrequency field of the imaging device.

9. The system of claim 8, wherein to determine, based on one or more characteristics of the body part, one or more individualized parameters corresponding to the subject, the at least one processor is configured to cause the system to perform the operations including:
   obtaining prior knowledge associated with the radiofrequency field in one or more portions of each of one or more reference body parts; and
   determining, based on the prior knowledge and the one or more characteristics of the body part, values of the one or more calibration parameters associated with the radiofrequency field of the imaging device, wherein the one or more calibration parameters associated with the radiofrequency field include at least one of a calibration parameter of a transmitting mode of the radiofrequency field or a calibration parameter of a radiofrequency pulse sequence.

10. The system of claim 9, wherein the calibration parameter of the transmitting mode includes at least one of an amplitude or a phase, and the calibration parameter of the radiofrequency pulse sequence includes at least one of an FOV corresponding to the radiofrequency pulse sequence or an initial value of radiofrequency transmitting gain associated with the radiofrequency pulse sequence.

11. The system of claim 1, wherein the one or more personalized parameters include resonance frequencies of different portions of the body part.

12. The system of claim 11, wherein to determine, based on one or more characteristics of the body part, one or more individualized parameters corresponding to the subject, the at least one processor is configured to cause the system to perform the operations including:
   determining, based on one or more characteristics of the body part, a frequency calibration model; and
   determining, based on the frequency calibration model, the resonance frequencies of different portions of the body part.

13. The system of claim 1, wherein the one or more individualized parameters include one or more calibration parameters associated with an image of at least a portion of the subject.

14. The system of claim 13, wherein a calibration parameter associated with an image includes at least one of a calibration parameter associated with a normalization sequence of uniformity of the image of the at least a portion of the subject or a calibration parameter associated with a normalization algorithm of the uniformity of the image of the at least a portion of the subject.

15. The system of claim 14, wherein the calibration parameter associated with the image reconstruction sequence includes at least one of an FOV or a resolution of the normalization sequence, and the calibration parameter associated with the normalization algorithm includes at least one of one or more filtering parameters associated with the image or a threshold associated with a signal to noise ratio (SNR) of the image.

16. The system of claim 1, wherein the at least one processor is further configured to cause the system to perform the operations including:
   monitoring, based on the one or more characteristics of the body part, one or more physiological parameters of the subject in the imaging scan.

17. The system of claim 16, wherein to monitor, based on one or more characteristics of the body part, one or more physiological parameters of the subject in the imaging scan, the at least one processor is further configured to cause the system to perform the operations including:
   obtaining, based on one or more characteristics of the body part of the subject, a physiological parameter model; and
   determining values of at least one of the one or more physiological parameters corresponding to one or more portions of the subject using the physiological parameter model, wherein the physiological parameter includes at least one of a specific absorption ratio (SAR) or a peripheral nerve stimulation (PNS).

18. The system of claim 1, wherein the scout image is acquired by scanning the subject according to a camera imaging or a positioning scanning sequence.

19. A method implemented on a computing device including at least one processor and at least one storage device, the method comprising:
   obtaining image data of a subject, the image data including pre-scanning data, a scout image, or a diagnostic image;
   determining one or more characteristics associated with a body part of the subject from the image data using a trained machine learning model, the one or more characteristics of the body part of the subject including at least one of position information of the body part in the subject, geometric morphology information of the body part, water content information, or fat content information;
   determining, based on the one or more characteristics associated with the body part, values of one or more individualized parameters corresponding to the subject; and
   causing an imaging device to perform an imaging scan on the subject according to the values of the one or more individualized parameters.

20. A non-transitory readable medium, comprising at least one set of instructions, wherein when executed by at least one processor, the at least one set of instructions directs the at least one processor to perform a method, the method comprising:
- obtaining image data of a subject by using camera imaging or a positioning scanning sequence;
- determining one or more characteristics associated with a body part of the subject from the image data using a trained machine learning model, the one or more characteristics of the body part of the subject including at least one of position information of the body part in the subject, geometric morphology information of the body part, water content information, or fat content information;
- determining, based on the one or more characteristics associated with the body part, values of one or more individualized parameters corresponding to the subject; and
- causing an imaging device to perform an imaging scan on the subject according to the values of the one or more individualized parameters.

* * * * *